United States Patent
Doerr et al.

(10) Patent No.: US 6,275,317 B1
(45) Date of Patent: Aug. 14, 2001

(54) HYBRID INTEGRATION OF A WAVELENGTH SELECTABLE LASER SOURCE AND OPTICAL AMPLIFIER/MODULATOR

(75) Inventors: Christopher Richard Doerr, Atlantic Highlands; John Evan Johnson, New Providence; Charles H. Joyner, Red Bank; Leonard Jan-Peter Ketelsen, Clinton; Uziel Koren, Fair Haven; Dirk Joachim Muehlner, Berkeley Heights, all of NJ (US); Rudolph Conrad Schweizer, South Whitewall Township, Lehigh County, PA (US); Lawrence Warren Stulz, Shark River Hills, NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/038,269

(22) Filed: Mar. 10, 1998

(51) Int. Cl.[7] .............................. H04B 10/00; H04J 14/02
(52) U.S. Cl. ........................... 359/180; 359/163; 359/124
(58) Field of Search ................................... 359/132, 133, 359/156, 163, 180, 181; 372/50, 23; 385/14, 1, 2, 8

(56) References Cited

U.S. PATENT DOCUMENTS

| 4,210,923 | 7/1980 | North et al. | 357/30 |
|---|---|---|---|
| 4,904,036 | 2/1990 | Blonder | 350/96.11 |
| 4,989,935 | 2/1991 | Stein | 350/96.11 |
| 5,134,671 | 7/1992 | Koren et al. | 385/14 |
| 5,288,659 | 2/1994 | Koch et al. | 437/129 |

(List continued on next page.)

OTHER PUBLICATIONS

Kurt E. Petersen, "Silicon as a Mechanical Material," Proceedings Of The IEEE, vol. 70, No. 5, May 1982, pp. 420–457.

(List continued on next page.)

Primary Examiner—Leslie Pascal
Assistant Examiner—Dalzid Singh
(74) Attorney, Agent, or Firm—J. De La Rosa

(57) ABSTRACT

A hybrid integrated optical transmitter comprising a wavelength selectable laser (WSL) source coupled to an optical amplifier/modulator has been realized. Disposed between the optical combiner and the optical amplifier/modulator is an "optical isolator." The optical isolator includes at least a Faraday rotator and, either solely or in combination with a single polarizer and/or half-wave plate is used to selectively rotate and pass polarized light egressing from the wavelength selectable laser source. Optical isolation is achieved by the egressing radiation from and back reflections incident on the laser source being at two mutually exclusive orthogonal polarization states or by the reflections being totally extinguished. Advantageously, the laser source is unresponsive to orthogonally polarized light, and hence any unwanted back reflections do not substantially affect the operating characteristics of the laser(s). Optical isolation may be further improved, however, with the use of an additional polarizer positioned in front of the Faraday rotator to totally extinguish the polarized back reflections. Preferably, a latching Faraday rotator is used. As such, permanent magnets are not needed to maintain the latching Faraday rotator in its saturated state, and substantially reduces cost, size and complexity of the transmitter package. The wavelength selectable laser source is integrated on a single substrate with an optical combiner that directs the radiation to the optical amplifier/modulator, which is integrated on a second substrate. Alternatively, the laser source and optical combiner may be integrated on different substrates.

48 Claims, 22 Drawing Sheets

U.S. PATENT DOCUMENTS

| | | | | |
|---|---|---|---|---|
| 5,373,385 | * | 12/1994 | Darcie et al. | 359/162 |
| 5,394,489 | | 2/1995 | Koch | 385/14 |
| 5,444,725 | | 8/1995 | Zirngibl | 372/20 |
| 5,479,544 | * | 12/1995 | Ono et al. | 385/37 |
| 5,568,303 | * | 10/1996 | Liedenbaum et al. | 359/184 |
| 5,574,742 | | 11/1996 | Ben-Michael et al. | 375/45 |
| 5,576,881 | | 11/1996 | Doerr et al. | 359/333 |
| 5,608,570 | | 3/1997 | Brandle, Jr. et al. | 359/321 |
| 5,642,447 | * | 6/1997 | Pan et al. | 385/31 |

OTHER PUBLICATIONS

Y. Seiwa et al., "High Power CW Operation over 400 mW On Five–Stripe Phase–Locked Laser Arrays Assembled By New Junction Down Mounting," J. Appl. Phys. 61(1), Jan. 1, 1987, pp. 440–442.

C. Dragone, "Efficient N x N Star Couplers Using Fourier Optics," Journal Of Lightwave Technology, vol. 7, No. 3, Mar. 1989, pp. 479–489.

U. Koren et al., "Wavelength Division Multiplexing Light Source With Integrated Quantum Well Tunable Lasers And Optical Amplifiers," Appl. Phys. Lett. 54(21) May 22, 1989, pp. 2056–2058.

Takeuchi et al., "Low–Loss Single–Mode GaAs/AlGaAs Miniature Optical Waveguides with Straight and Bending Structures," Journal Of Lightwave Technology, vol. 7, No. 7, Jul. 1989, pp. 1044–1054.

Ippen et al., "Additive Pulse Mode Locking," J. Opt. Soc. Am. B/vol. 6, No. 9, Sep. 1989, pp. 1736–1745.

Zirngibl et al., "Digitally Tunable Laser Based on the Integration of a Waveguide Grating Multiplexer and an Optical Amplifier," IEEE Photonics Technology Letters, vol. 6, No. 4, Apr. 1994, pp. 516–518.

J.M. Verdiell et al., "8–Wavelength DBR Laser Array Fabricated with a Single–Step Bragg Grating Printing Technique," IEEE Photonics Technology Letters, vol. 5, No. 6, Jun. 1993, pp. 619–621.

Zirngibl et al., "Digitally Tunable Laser Based on the Integration of a Waveguide Grating Multiplexer and an Optical Amplifier," IEEE Photonics Technology Letters, vol. 6, No. 4, Apr. 1994, pp. 156–518.

Joyner et al., "An 8–Channel Digitally Tunable Transmitter with Electroabsorption Modulated Output by Selective–Area Epitaxy," IEEE Photonics Technology Letters, vol. 7, No. 9, Sep. 1995, pp. 1013–1015.

Koren et al., "Polarisation Insensitive Semiconductor Optical Amplifier With Integrated Electroabsorption Modulators," Electronics Letters, 18th Jan. 1996, vol. 32, No. 2, pp. 111–112.

* cited by examiner

CHANNEL 6

CHANNEL 7

CHANNEL 8

CHANNEL 9

CHANNEL 10

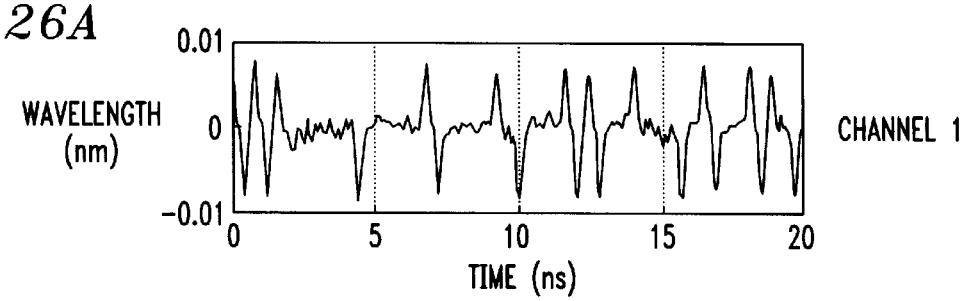
FIG. 26A — CHANNEL 1
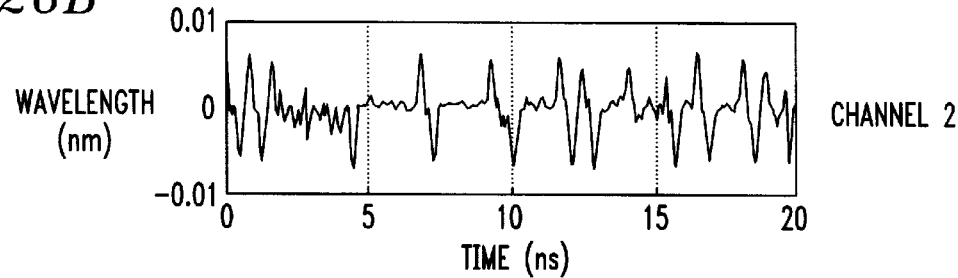
FIG. 26B — CHANNEL 2
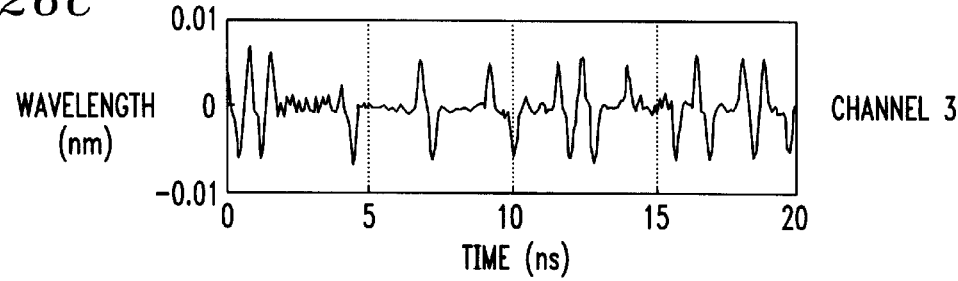
FIG. 26C — CHANNEL 3
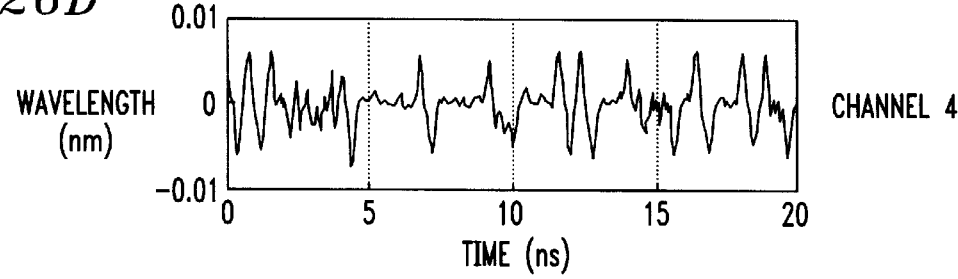
FIG. 26D — CHANNEL 4
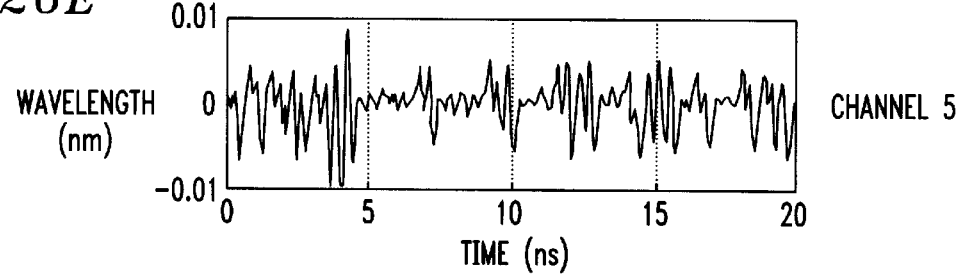
FIG. 26E — CHANNEL 5

HYBRID INTEGRATION OF A WAVELENGTH SELECTABLE LASER SOURCE AND OPTICAL AMPLIFIER/MODULATOR

TECHNICAL FIELD

The present invention relates to optical communications and, more particularly, to wavelength division multiplexing (WDM) transmitters having a hybrid integrated wavelength selectable laser source and optical amplifier/modulator.

BACKGROUND OF THE INVENTION

It is well known in the art that wavelength division multiplexing (WDM) affords multiple channel communications over a single optical fiber link, thereby increasing transmission capacity without the need for higher speed components. For switching or networking applications, wavelength division multiplexing, moreover, permits optical routing of signals at different wavelengths to different destinations or stations.

Optical transmitters, however, used in wavelength division multiplexing must critically generate light at controlled wavelengths, either fixed or dynamically selectable. Such transmitters must restrict the wavelengths to preselected spaced values so that the optical signals do not interfere with each other. As such, wavelength division multiplexing systems benefit importantly from highly stable, wavelength selectable optical transmitters and, more particularly, from those producing modulated light with low chirp, i.e., low uncontrolled wavelength shifts.

Among the first attempts to provide such stable wavelength selectable transmitters were those using discrete fixed frequency lasers. An array of lasers, for example, comprising distributed Bragg reflector (DBR) lasers, is each integrated with an electroabsorption modulator, followed by an optical combiner and amplifier so as to provide multiple wavelength division channels over a single fiber link. An example of this approach is shown in the article by M. G. Young et al., entitled "A 16×1 WDM Transmitter With Integrated DBR Lasers and Electroabsorption Modulators," Paper No. IWA3, *Technical Digest of* 1993 *Topical Meeting on Integrated Photonics Research,* Palm Springs (1993) pp. 414–17. Unfortunately, such an approach requires a modulator for each laser, thereby requiring a complex electrical packaging to drive each modulator separately.

An alternative to the above approach has recently been developed wherein the cost and complexity make it more attractive for communication systems having a large number of optical channels, such as for local area networks and "fiber to the home" applications. This latter alternative monolithically integrates on a single substrate individually actuable lasers with an optical combiner. The output of the combiner containing the different wavelengths advantageously passes through only a single optical modulator, which is also likewise integrated on the same substrate. Of course, in this latter case, each wavelength is modulated on a time division basis with separate signals. See, U.S. Pat. No. 5,394,489, entitled "Wavelength Division Multiplexed Optical Communication Transmitters," which is incorporated herein by reference and commonly assigned.

Although optical transmitters based on the above latter approach perform acceptably, the material compatibility imposed by the monolithical integration may compromise the performance of the optical devices. Furthermore, and more importantly, such optical transmitters are substantially prone to having high chirp because of unwanted optical feedback. The extensive time resolved spectra (TRS) testing required and cost associated therewith to ensure that the chirp requirements are met make this approach unattractive for most optical communication systems.

SUMMARY OF THE INVENTION

In accordance with the principles of the invention, a hybrid integrated optical transmitter comprising a wavelength selectable laser (WSL) source coupled to an optical amplifier/modulator via an optical combiner has been realized. Disposed between the optical combiner and the optical amplifier/modulator is an "optical isolator." The optical isolator preferably includes at least a Faraday rotator and half-wave plate. Optical isolation may be achieved by the egressing radiation from, and back reflections incident on the laser, being at two mutually exclusive orthogonal polarization states or by the unwanted back reflections being totally extinguished.

More specifically, a Faraday rotator, either solely or in combination with a single polarizer and/or half-wave plate is used to selectively rotate and pass polarized light egressing from the wavelength selectable laser source. Unwanted reflections, although not necessarily totally extinguished, are at least orthogonally polarized. Advantageously, the laser(s) is unresponsive or substantially insensitive to the orthogonally polarized light, and hence any unwanted back reflections do not affect the operating characteristics of the laser (s). Optical isolation may be further improved, however, with the use of an additional polarizer positioned in front of the Faraday rotator to totally extinguish the orthogonally polarized back reflections. Furthermore, a latching Faraday rotator is preferred. In this manner, permanent magnets are not needed to maintain the Faraday rotator in its saturated state, and, as such, substantially reduces cost, size and complexity of the transmitter package.

In one embodiment, the wavelength selectable laser source is integrated on a single substrate with an optical combiner that directs the radiation to the optical amplifier/modulator integrated on a second substrate. Alternatively, the laser source and optical combiner may be integrated on different substrates. Regardless of the configuration, these optical components are assembled, and then aligned with respect to each other on an optical platform so as to afford ease of manufacturability and separate optimization control over the optical components. The wavelength selectable laser source includes single tunable lasers, multiple frequency lasers (MFLs), or laser array structures, such as distributed Bragg reflector (DBR) laser arrays, and distributed feedback (DFB) laser arrays.

Moreover, the laser source may be temperature regulated and/or use feedback control to compensate for environmental variations, such as temperature variations or performance degradations.

BRIEF DESCRIPTION OF THE DRAWINGS

The features and advantages of the present invention will become more readily apparent from the following detailed description of the invention in which like elements are labeled similarly and in which.

DETAILED DESCRIPTION

In accordance with the principles of the invention, a hybrid integrated optical transmitter comprising a wavelength selectable laser (WSL) source coupled to an optical amplifier/modulator has been realized, which affords ease of manufacturability and separate optimization control over the optical components. It should be understood that the term "optical amplifier/modulator" herein refers to an optical modulator having optically coupled thereto an optical amplifier, and preferably integrated with the optical amplifier on a single photonic integrated chip (PIC).

A Faraday rotator, either solely or in combination with at least a polarizer, may be used to selectively rotate and pass linearly polarized light egressing from the wavelength selectable laser source. Alternatively, the polarizer may be judiciously replaced with, or used in combination with a wave-plate having the appropriate relative retardation, such as a half-wave plate. This is in contrast to conventional so called "optical isolators" which employ a polarization rotator disposed typically between two crossed polarizers. Optical isolation may be achieved by the egressing radiation from, and back reflections incident on the laser source being at two mutually exclusive orthogonal polarization states, or by the back reflections being totally extinguished, as discussed more fully herein below.

Preferably, the wavelength selectable laser source is designed to be polarization sensitive so as to provide gain exclusively for light polarized along only a predetermined direction, preferably for TE polarized light. Unwanted reflections from the optical amplifier/modulator, although not necessarily extinguished, are however, at least orthogonally polarized. Advantageously, the laser source is unresponsive or substantially insensitive to this orthogonally polarized light, and hence any unwanted back reflections do not affect the operating characteristics of the laser source. Optical isolation may be further improved, however, with the use of an additional TE polarizer positioned in front of the Faraday rotator to totally extinguish the orthogonally or TM polarized back reflections. As such, optical isolation can be effected through the use of a single Faraday rotator, or in combination with a single polarizer and/or half-wave plate, reducing cost, size and complexity of the transmitter package.

Figure 1:
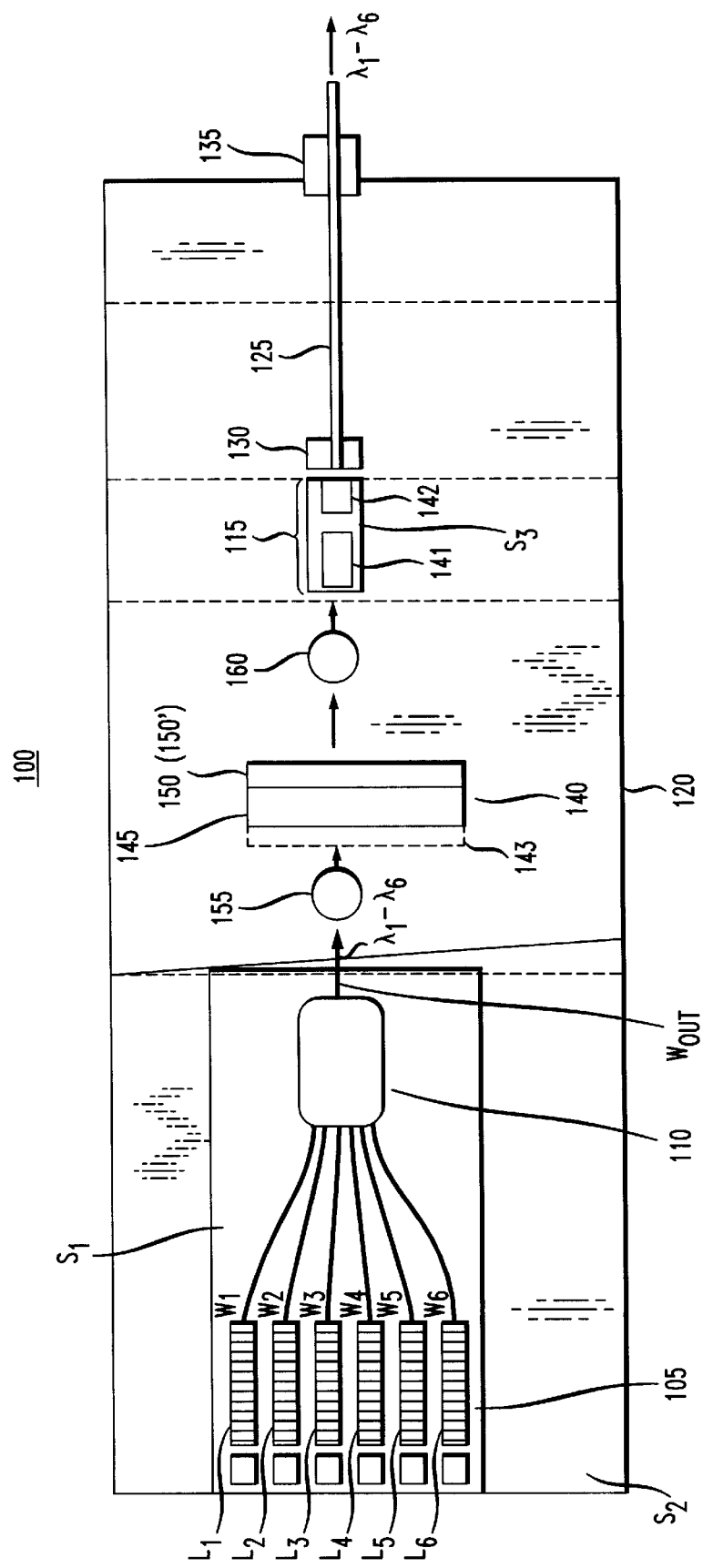
FIG. 1 is a top view of a hybrid integrated wavelength selectable optical transmitter in accordance with the principles of the invention.
Figure 2:
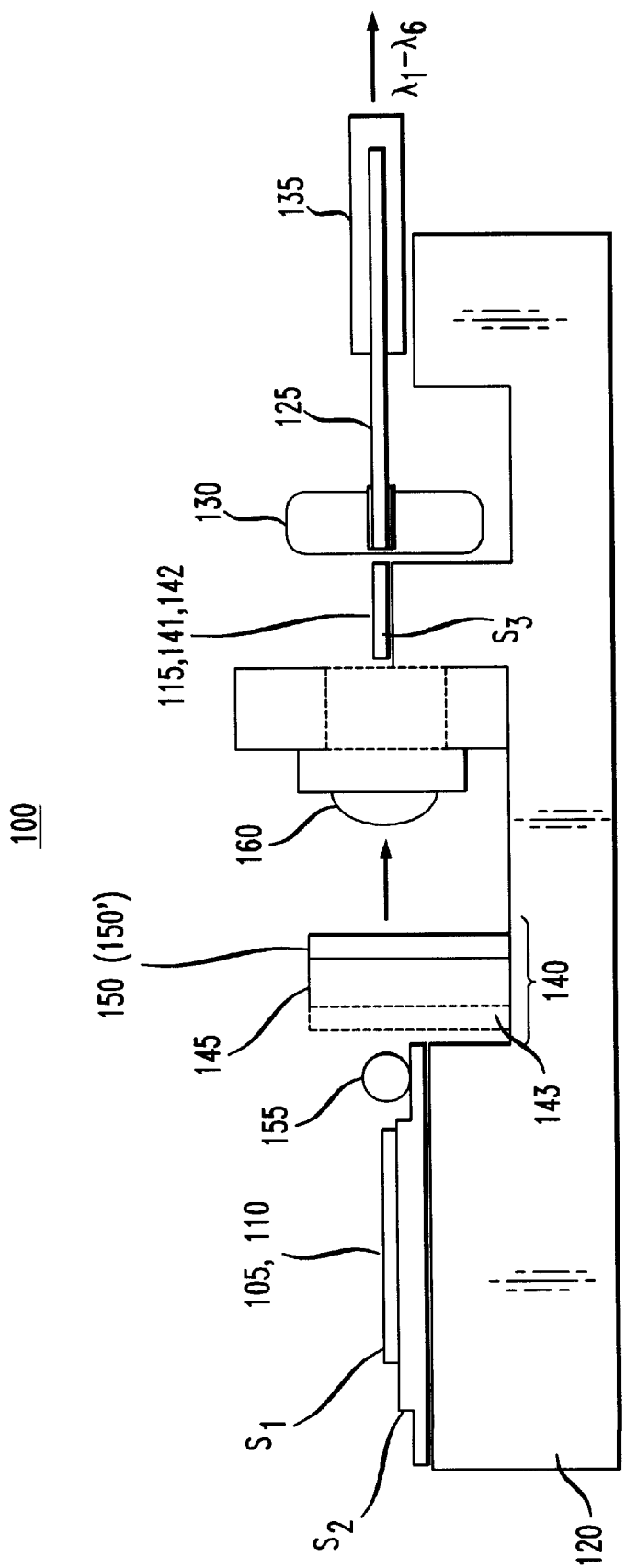
FIG. 2 is a side view of the hybrid integrated wavelength selectable optical transmitter of FIG. 1.

In accordance with the principles of the invention, a first exemplary embodiment of a hybrid integrated wavelength selectable laser source and optical amplifier/modulator is schematically depicted in FIGS. 1–2. Those skilled in the art will readily note that this hybrid integration approach advantageously utilizes the well known optical bench technology to effect optical alignment and assembly between the different optical components. See, for example, U.S. Pat. Nos. 4,904,036; 4,210,923; and 4,989,935, which are incorporated herein by reference.

Hybrid integrated optical transmitter 100 comprises a semiconductor laser array 105, optical combiner 110, and optical amplifier/modulator 115, which are all mechanically supported on and affixed to a platform 120, such as a Beo or copper platform. For operating wavelengths, $\lambda_s$, of about 1.0 $\mu$m and greater, group III–V or II–VI semiconductors may be used, such as InGaAs/InGasP or InGaAsP/InP. A lensed fiber 125 may be used to couple to the egressing radiation from optical amplifier/modulator 115. Lensed fiber 125 is positioned and aligned to optical amplifier/modulator 115 using properly dimensioned ferrules 130 and 135, or using, for example, UV cured expoxy.

Laser array 105 may be any of the well known GaAlAs or InGaAsP/InP laser array structures. For example, laser array 105 may include distributed Bragg reflector (DBR) lasers, or distributed feedback (DFB) lasers. Alternatively, multiple frequency lasers (MFLs), tunable lasers, or any other form having a controlled emission wavelength may be used. The use of fixed frequency lasers, however, permits the generation of well-controlled wavelength spacing.

Interposed between optical combiner 110 and optical amplifier/modulator 115 is an optical isolator 140. Optical amplifier/modulator 115 comprises optical amplifier 141, preferably integrated with optical modulator 142. Optical amplifier 141 amplifies and optical modulator 142 then modulates optical radiation egressing from laser array 105 at wavelengths greater than $\lambda_s$, With the optical modulator positioned after first combining the radiation wavelengths of each laser in the array, the transmitter package requires only one high speed drive while still maintaining access to all wavelength channels.

Details about the operations and fabrication of semiconductor optical amplifiers are well known to those skilled in the art and, for example, are also disclosed in a tutorial article in theIEEE Spectrum, pp. 26–33, May 1984. Also, see, T. Mukai et al., *Optical Amplification By Semiconductor Lasers, Semiconductor and Semi-metals,* Vol. 22, ed. By W. T. Tsang, Part E, pp. 265–319 (Academic Orlando 1985).

Figure 3:
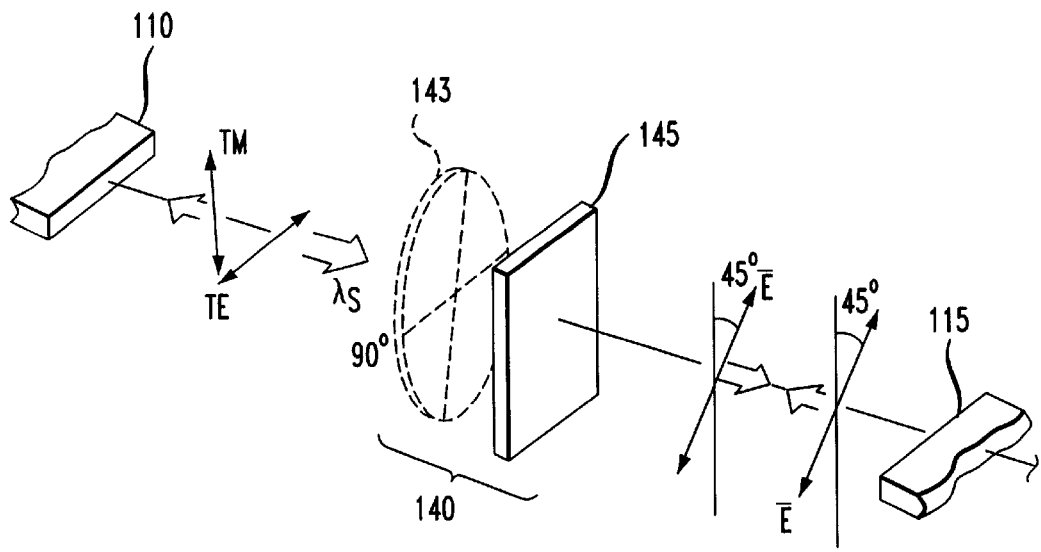
FIG. 3 depicts the polarization states for propagating and counter-propagating radiation traversing through an optical isolator comprising at least a Faraday rotator.
Figure 4:
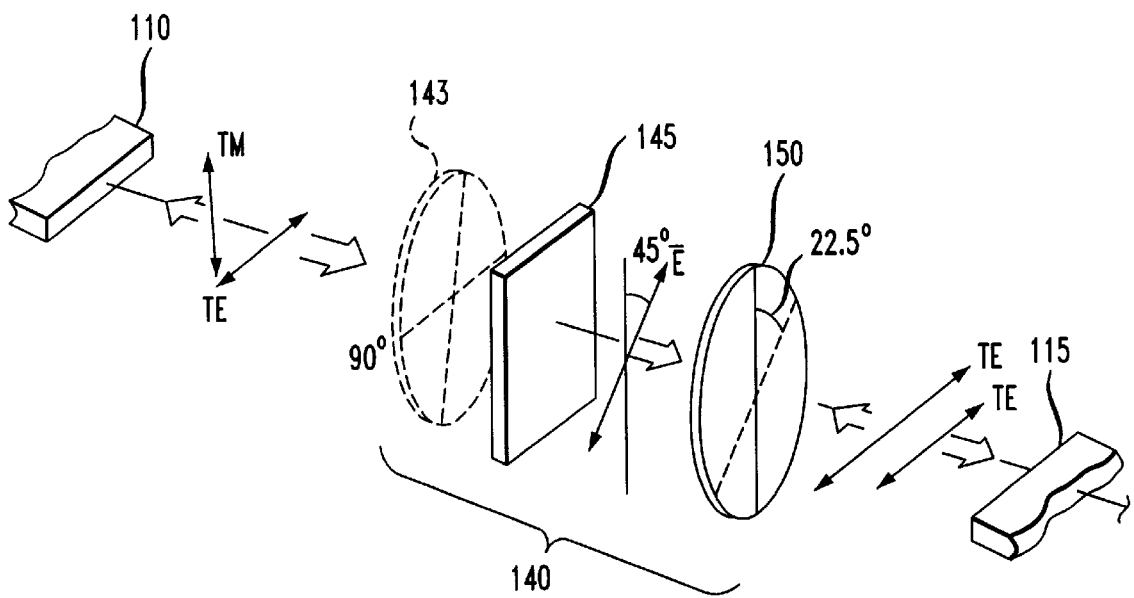
FIG. 4 depicts the polarization states for propagating and counter-propagating radiation traversing through an optical isolator comprising at least a Faraday rotator and half-wave plate.
Figure 5:
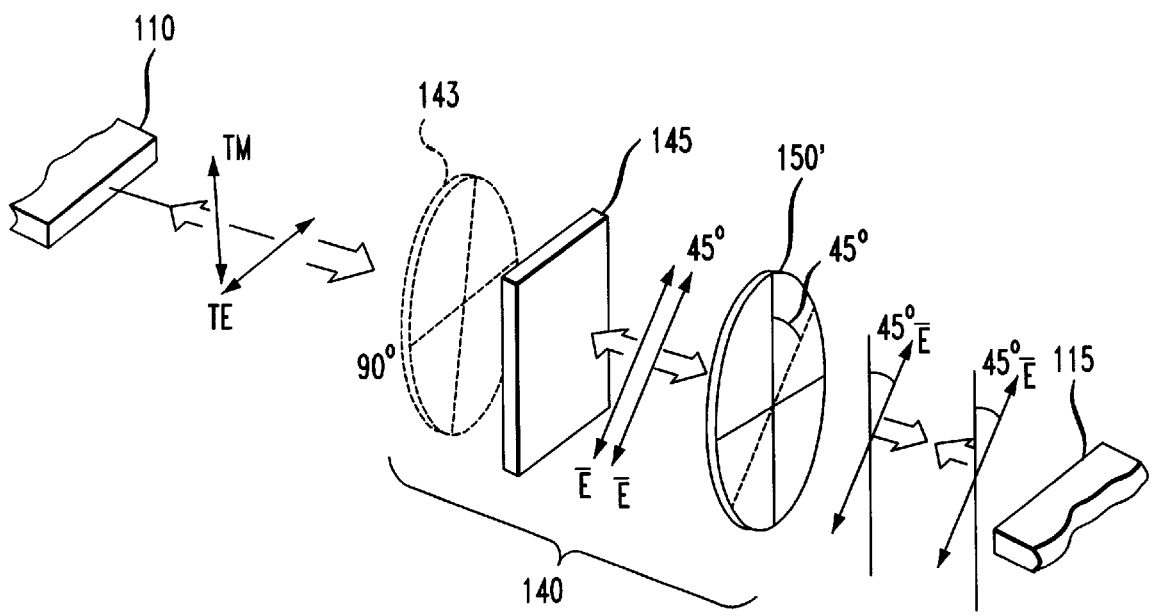
FIG. 5 depicts the polarization states for propagating and counter-propagating radiation traversing through an optical isolator comprising at least a Faraday rotator and polarizer.

In order to better understand the optical isolation between laser array 105 and amplifier/modulator 115, illustrative depictions of the polarization states of the propagating light are depicted in FIGS. 3–5. The polarization states for both propagating and counter-propagating radiation are shown.

Referring to FIG. 3, consider radiation, $\lambda_s$, from laser array 105 egressing from optical combiner 115 and incident on optical isolator 140, here consisting of a single 45° Faraday rotator 145, which is preferably slightly tilted a few degrees to minimize back reflections into the laser. If the incident radiation is TE polarized, upon traversing through Faraday rotator 145 the light is rotated 45°.

Unwanted radiation reflected from the end facet of the optical modulator after passing back through the Faraday rotator is again rotated 45°. Although the unwanted reflection is not extinguished, it is TM polarized or orthogonal to the polarization state of the egressing light. Inasmuch as wavelength selectable laser 105 is designed to provide gain exclusively for TE polarized light, the TM polarized reflections do not affect the operating characteristics of the laser source.

If desired, an additional polarizer 143 (shown in dashed lines) having a transmission axis co-parallel (TE) with the polarization state of the incident radiation may be positioned in front of Faraday rotator 145 to totally extinguish the TM polarized back reflections.

Alternatively, optical isolator 140 may consist of Faraday rotator 145 and a half-wave plate 150 oriented at 22.5° with respect to the vertical axis. The polarization states of the propagating light are depicted in FIG. 4. TE polarized light traversing through Faraday rotator 145 and half-wave plate 150 maintains its polarization state, but reflected light from the optical modulator after traversing back through optical isolator 140 is now orthogonally rotated or TM polarized. In this alternative embodiment, optical amplifier 115 is polarization sensitive and as such, half-wave plate 150 is used to properly orient the polarization state of the egressing radiation so as to be coupled into the optical amplifier/modulator. Also TE polarizer 143 may be positioned in front of Faraday rotator 145 to totally extinguish the TM polarized back reflections.

In still another alternative, optical isolator 140 may consist of Faraday rotator 145 and a polarizer 150' having its transmission axis oriented at 45° with respect to the vertical axis. In this latter instance, incident radiation after traversing through optical isolator 140 is polarized 45° with respect to the incident radiation. Unwanted reflections that propagate back through the optical isolator are rotated likewise 45° or TM polarized. Again, TE polarizer 143 may be positioned in front of Faraday rotator 145 to extinguish the back reflections, if desired.

Referring now back to FIGS. 1–2, laser array 105, comprising here of six (6) fixed frequency DFB lasers, $L_1$–$L_6$, operate at respectively different wavelengths $\lambda_1$–$\lambda_6$. Optical combiner 110 fabricated with six (6) input waveguides, $W_1$–$W_6$, combines the different wavelengths from each corresponding laser within array 105 into a single output, $W_{out}$. Preferably, optical combiner 110 utilizes a slab waveguide region wherein the different wavelength radiations each diffracts in the plane of the substrate to equally illuminate the output. Suitable structures for optical combiner 115 are disclosed in the article by C. Dragone, "Efficient N×N Star Couplers Using Fourier Optics," *IEEE Journal of Lightwave Tech.* Vol. 7, No. 3, pp. 479–89 (March 1989); and M. Zirngibl et al., "Efficient 1×16 Optical Power Splitter Made on InP," *Electron. Lett.* 28, pp. 1212–13 (1992). It should, however, be clearly understood that in the aforementioned article of Dragone, only one of the output of the N×N star coupler is used in the present embodiment of the invention. Of course, optical combiner 110 may alternatively use well known Y-branch tree structures, or other suitable branching waveguide structures.

Standard fabrication techniques are used to monolithically integrate laser array 105 and optical combiner 110 onto a single substrate $S_1$, preferably an InP substrate. Optical combiner 110, however, may be fabricated on a separate substrate and then positioned on platform 120 adjacent to laser array 105. To facilitate alignment between laser array 105 and optical combiner 110, the active portions of the lasers are preferably mounted "junction down," as described, for example, in Y. Seiwa et al., "High Power CW Operating over 400 mW on Five-Stripe Phase-Locked Laser Arrays Assembled By New Junction Down Mounting," *Journal of Applied Physics,* Vol. 61, pp. 440–42 (1987).

Fabrication techniques for integrating the individual elements of hybrid optical transmitter 100 may be adapted from those techniques appearing in the article by Thomas L. Koch et al., entitled "Semiconductor Photonic Integrated Circuits," *IEEE J. Quantum Electron.,* Vol. QE-27, pp. 641–53 (1991), and U.S. Pat. No. 5,288,659, which are incorporated herein by reference.

It should be clearly understood that the various optical components are precisely positioned relative to each other on platform 120 through the use of complementary features, such solder bumps, mechanical features or optical fiducial that are fabricated on, for example, optical platform 120. For example, selective surface etching of grooves and rails may be used to facilitate alignment to the laser active portion(s).

An alternative to this grooves-rails approach is by means of V-groove surface features on submount $S_2$. For a survey of applicable silicon etching technology see, for example, K. E. Petersen, "Silicon as Mechanical Material," *Proceedings of the IEEE,* Vol. 70 (1982), pp. 420–57 (1982).

Moreover, the height of each component above the optical platform can be fixed to the desired distance by mounting the component on pedestal(s), the thickness of which is controlled during the fabrication of the platform. Furthermore, metallic trace patterns may be fabricated on optical platform 120 to electrically contact laser array 105, and/or optical amplifier/modulator 115. If desired, the optical components can either be epoxied or soldered to optical platform 120 so as to affix each component to the platform. For example, alloy compositions of lead and tin can be used for soldering.

Regarding specific fabrication techniques for the laser array, see, for example, J. M. Verdiell et al., "8-Wavelength DBR Laser Array Fabricated with A Single-Step Bragg Grating Printing Technique," *IEEE Phot. Tech. Lett.* 5, pp. 619–21 (1993); and Thomas L. Koch et al., *IEEE J. Quantum Electron.,* Vol. QE-27, pp. 641–53 (1991). Also, for a suitable InGaAsP/InP waveguide technology to fabricate the optical combiner, see the article by M. Zirngibl et al., "Efficient 1×16 Optical Power Splitter Made on InP," *Electron. Lett.* 28, pp. 1212–13 (1992).

Optical platform 120 can comprise one or more submounts of copper, diamond, silicon, ceramic or the like. The material chosen for optical platform 120 is dependent on the desired application with respect to mechanical, thermal and electrical considerations. Copper or BeO may be used as the optical platform, with laser array 105 mounted on a silicon optical submount $S_2$. Those skilled in the art will readily recognize that a silicon optical submount also allows the mature IC manufacturing technology to be exploited in aligning the optical components to each other.

It is contemplated that the waveguide structures of the optical combiner may be fabricated using waveguide mesas formed by conventional photolithographic masking and etching techniques. Alternatively, buried waveguide structures may also be used. See, for example, T. L. Koch et al., "Semiconductor Photonic Integrated Circuits," *IEEE Journal of Quantum Electronics,* Vol. 27, No. 3 (March 1991); and U. Koren et al., "Wavelength Division Multiplexing Light Sources with Integrated Quantum Well Tunable Lasers and Optical Amplifiers," *Appl. Phys. Lett.* 54(21), (May 22, 1989).

Optical amplifier/modulator 115 may utilize an electroabsorption bulk modulator structure, as disclosed in the article by U. Koren et al., "Polarisation Insensitive Semiconductor Optical Amplifier With Integrated Electroabsorption Modulators," *Electron. Lett.,* Vol. 32, No. 2, pp. 111–12 (January 1996). Also, directional coupler modulators as well as Mach-Zehnder modulators may be used. In the former instance, such optical amplifier/modulators are polarization insensitive. Hence, egressing radiation from laser array 105 through optical isolator 140, although polarization rotated, is still amplified and modulated by optical amplifier/modulator 115. Alternatively, and more preferably, a polarization sensitive optical amplifier/modulator may be used. In this latter case, optical isolator 140 preferably includes a half-wave plate positioned in front of the optical amplifier/modulator so as to properly orient the polarization state of the egressing radiation so as to be coupled into the optical amplifier. Alternatively, an output polarizer (TE) may be used, but would of course introduce a coupling loss of about 3db.

Optical amplifier 141 and optical modulator 142 are preferably monolithically integrated on a substrate $S_3$, different than substrate, $S_1$, on which laser array 105 is fabricated. In this manner, each optical component may be optimized independently with respect to performance without the problems of material compatibility, and then appropriately assembled on platform 120.

By way of iteration, disposed between optical combiner 110 and optical amplifier/modulator 115 is "optical isolator" 140. A 45° Faraday rotator 145, preferably a latching Faraday rotator, and a half-wave plate 150' may be employed to effect optical isolation between the laser(s) and the optical amplifier/modulator, as discussed herein above. Also, an additional TE polarizer 143 may be positioned in front of Faraday rotator 145 to totally extinguish any back reflections. The latching Faraday rotator is preferably implemented using the structure disclosed in the article by V. J. Fratello et al., entitled "Innovative Improvements In Bismuth Doped Rare Earth Iron Garnet," *IEEE Transactions On Magentics,* Vol. 32, No. 5, pp. 4102–17 (1996); and U.S. Pat. No. 5,608,570, which are incorporated herein by reference. Such latching Faraday rotators utilize the Faraday effect in rare earth iron garnets, such as $(Bi_xTb_{1-x})_3(Fe_yGa_{1-y})_5O_{12}$, which advantageously have a relatively low saturation magnetization. Accordingly, permanent magnets are not needed to maintain the Faraday rotator in its saturated state. Such magnetless Faraday rotators substantially reduce cost, size and complexity, and, hence, make the present hybrid integration attractive for numerous optical communication applications.

To increase the collection efficiency of the egressing radiation into the optical amplifier/modulator, microlenses may be used to match the size of the egressing radiation to the dimensions of the optical amplifier/modulator. In particular, ball lenses 155 and 160 disposed therebetween may be used to realize this benefit. Pyramid-shaped pits fabricated on submount $S_2$ can be used to hold the microlenses. Furthermore, to relax the alignment tolerance between the optical components, beam expanders may be used on the output waveguide $W_{out}$ of optical combiner 110, as well as on the input of optical amplifier/modulator 115. Preferably, such beam expanders are integrated on the same substrate as their corresponding optical component. For example, tapered beam expander waveguides may be used as disclosed in U.S. Pat. No. 5,574,742, entitled "Tapered Beam Expander Waveguide Integrated With A Diode Laser."

Wavelength selectability is achieved by simply activating the desired laser within laser array 105. An external signal may be applied to the optical amplifier/modulator to appropriately modulate the desired wavelength radiation in a manner well known in the art. For multiple wavelength operation, such as packet routing, each laser may be actuated on a time division basis. Optical amplifier/modulator 115 then modulates each wavelength on a time division basis with corresponding signals specific to each wavelength.

Figure 6:
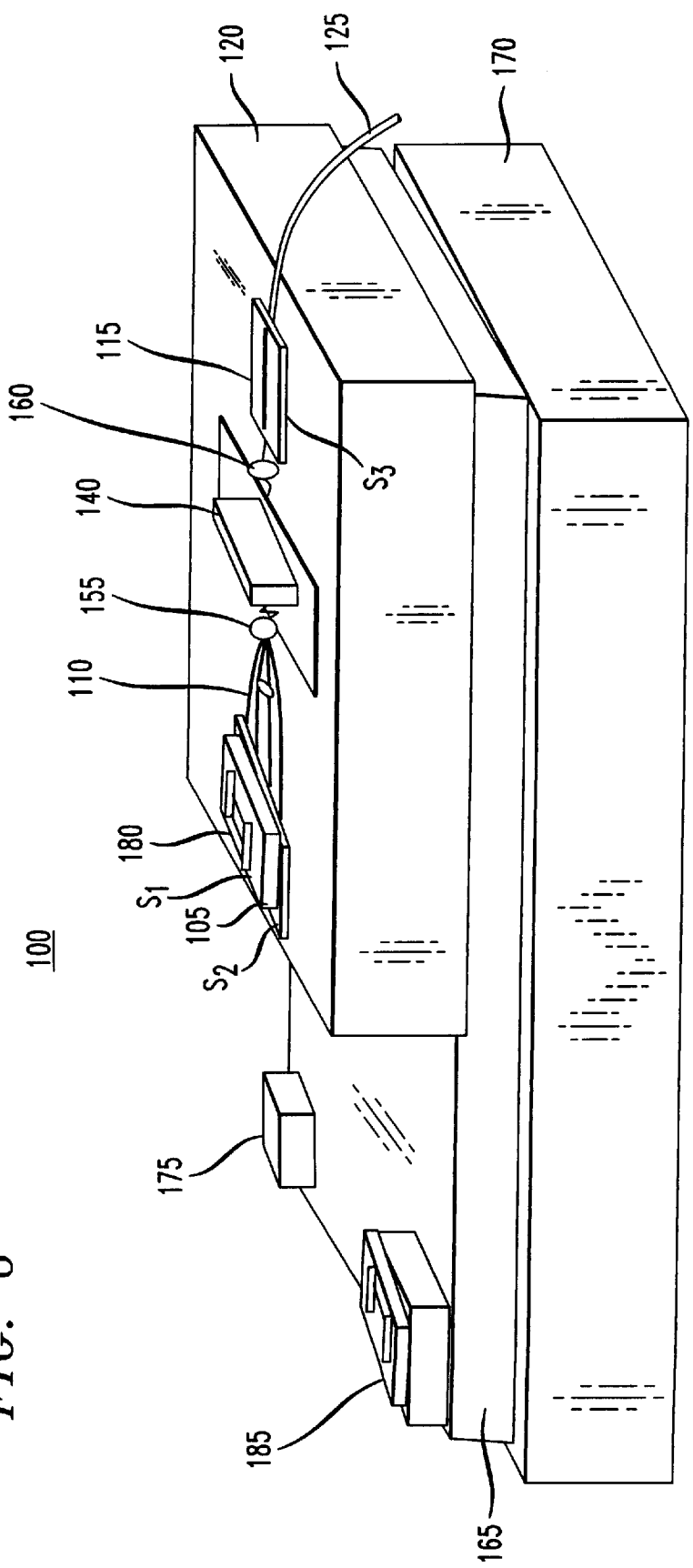
FIG. 6 depicts another embodiment of the present invention similar to that of FIGS. 1–2, except employing a temperature tuning scheme to adjust the lasing wavelengths of the hybrid integrated wavelength selectable optical transmitter of the present invention.

Referring now to FIG. 6, there is illustrated another embodiment of the present invention similar to that of FIGS. 1–2, except employing a temperature tuning scheme to adjust the lasing wavelengths of laser array 105. Platform 120 is disposed on a submount 165, which in turn is disposed on a thermoelectric cooler 170 (TEC). Thermoelectric cooler 170 serves to maintain the temperature of hybrid transmitter 100 at a nominal temperature, T, corresponding to predetermined operating wavelengths. Excellent temperature control may be realized using a thermistor 175 disposed on submount 165 in a feedback configuration with thermoelectric cooler 170. The wavelength of the egressing radiation can be fine tuned by varying the temperature of the transmitter package, since changes in temperature cause corresponding variations in the refractive index of the active medium and hence changes in the effective length of the laser cavity.

As an alternative to the temperature control of the entire transmitter package, heating or cooling may be applied locally and selectively only to the laser array. For example, a resistive heater 180, such as a chromium heater strip, may be disposed on laser array 105 to control the temperature of the active medium, thereby allowing the operating point of the laser array to be rapidly switched from one wavelength to another. While the use of a localized heater is beneficial for rapid switching, in operation such a localized heater offsets the effective heat load to thermoelectric cooler 170. As such, it is contemplated that a compensating heater 185 disposed on optical submount 165 be used to keep constant the total heat load to the thermoelectric cooler. This may be expressed mathematically as follows:

$$\Phi_{TE} = \Phi_c + \Phi_l \quad (1)$$

$$\Phi_l + \Phi_c = C \quad (2)$$

where C is a constant, $\Phi_l$ is the heat output of the localized heater, $\Phi_{DE}$ is the heat input of the thermoelectric cooler, and $\Phi_c$ is the heat output of the compensating heater.

For error-free transmission, the intensity of the optical radiation from the laser array should be maintained within a predetermined range. It is contemplated that this may be accomplished by diverting some of the optical radiation from the laser array to a monitoring photodetector which measures the average power egressing therefrom. The photodetector, such as a p-i-n photodidode, may be coupled to the output waveguide $W_{out}$ of optical combiner 110 so as to generate a signal which may be applied to a feedback circuit in order to adjust the laser bias current. This photodetector may be integrated on substrate $S_1$ with the optical combiner or fabricated on a different substrate and positioned on platform 120 in a hybrid manner. In the former case, suitable fabrication techniques may be adapted as appearing in U.S. Pat. No. 5,288,659, entitled "Photonic-Integrated Circuit Fabrication Process," which is incorporated herein by reference. Such feedback control is beneficial, if not necessary, to compensate for environmental variations, such as temperature variations or performance degradations.

Furthermore wavelength monitoring photonics, such as spectrometers, may be coupled externally to the laser array to monitor wavelength variations. It should be clearly understood that the wavelength monitoring device may be fabricated on a separate substrate and appropriately placed on platform 120 or integrated with laser array 105. In either case, suitable feedback controls well known in the art may be employed to correct for any deviations, such as by adjusting the temperature of the laser array.

In an example from experimental practice, a InP DFB laser array and InP optical amplifier/modulator fabricated on individual photonic integrated circuit (PIC) chips are packaged in a conventional "14-pin butterfly" laser package. Each chip is mounted on a copper submount, which in turn is mounted on a thermoelectric cooler (TEC) inside the butterfly package. The InP laser array consisted of six λ/4 shifted DFB InP lasers, each thermally tunable over eight (50 GHz) WDM channels. Because of the partial overlapping of the tunability ranges, only 32 channels can be accessed. A thin film ceramic 50Ω resistor (500×500 μm area) is disposed on the laser array to effect localized thermal tuning, as discussed herein above. Also, a matched compensating 50Ω resistor is placed a similar distance from a monitoring thermistor to keep a constant heat load output, thereby preventing any temperature drift during channel switching. Due to the small thermal mass of the laser array and the thermal resistor, the thermal tuning is faster than that achieved using a conventional thermoelectric cooler (TEC). Indeed, experimental measurements indicate that for a 0.2 nm channel spectral window, the switching time for a 90% turn-on of a new channel is about 160 msec.

As discussed herein above, the laser array is fabricated on the same InP chip with a passive waveguide combiner feeding the laser output into a single mode waveguide. The output waveguide is coupled through a collimating ball lens to an optical isolator consisting of a latching 45° garnet Faraday rotator disposed between a TE polarizer and λ/2 waveplate. The total thickness for the optical isolator is only 850 μm: 200 μm for the TE polarizer, 500 μm for the Faraday rotator and 150 μm for the waveplate. Collimated light egressing from the optical isolator is TE polarized and is then focused onto the amplifier/modulator chip using an aspheric micro-lens. Any unwanted reflections from the optical amplifier/modulator, are orthogonally polarized (TM), by the Faraday rotator and λ/2 waveplate, and hence do not propagate through the TE polarizer.

For this experimental arrangement, a fiber was cleaved and directly butt coupled to the front facet of the optical amplifier/modulator. Also, the input facet of the optical amplifier/modulator is AR coated with a SiO thin film. On the output facet of the optical amplifier/modulator, however, a $TiO_2$ AR coating is applied to minimize reflections between the optical amplifier/modulator and the output fiber.

Figure 7:
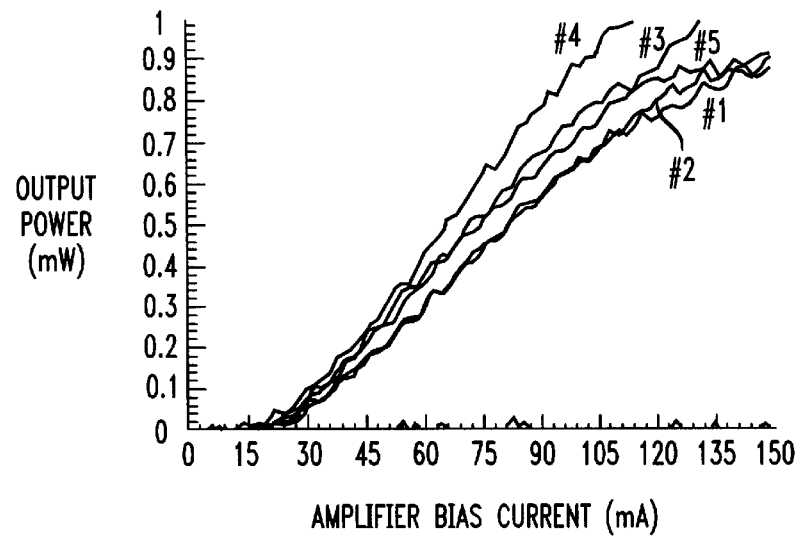
FIG. 7 depicts the light versus current characteristics for the hybrid integrated wavelength selectable optical transmitter of FIG. 1.
Figure 8:
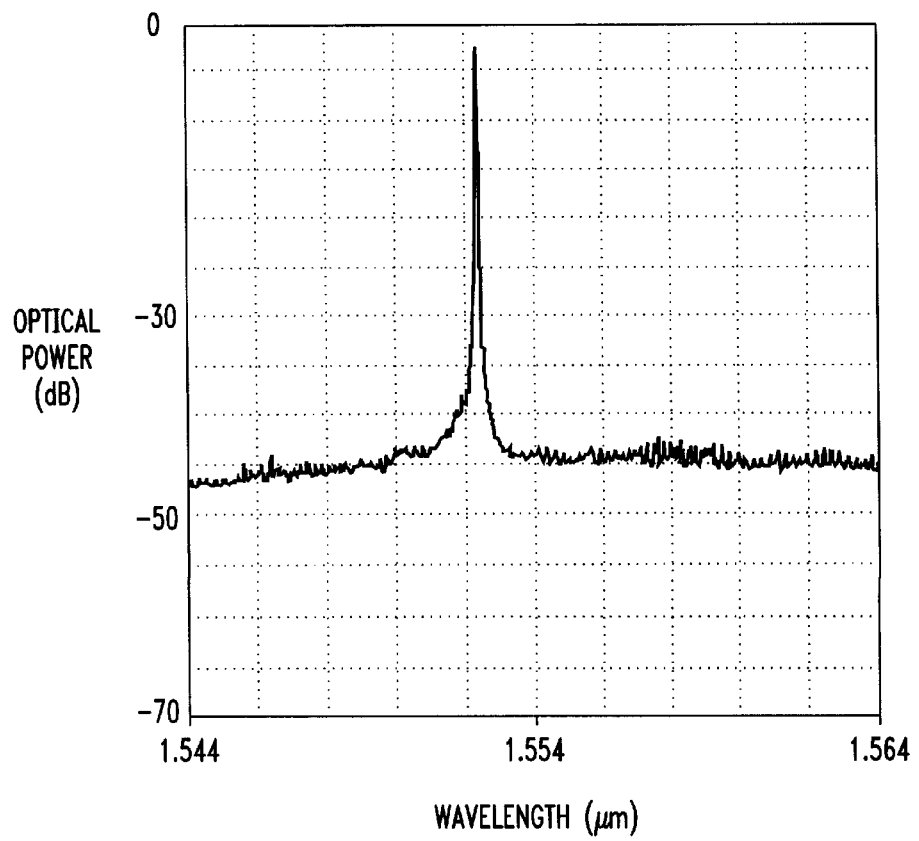
FIGS. 8 and 9 depict the wavelength spectra for the hybrid integrated wavelength selectable optical transmitter of FIG. 1 with the laser turn "on" and "off," respectively.
Figure 9:
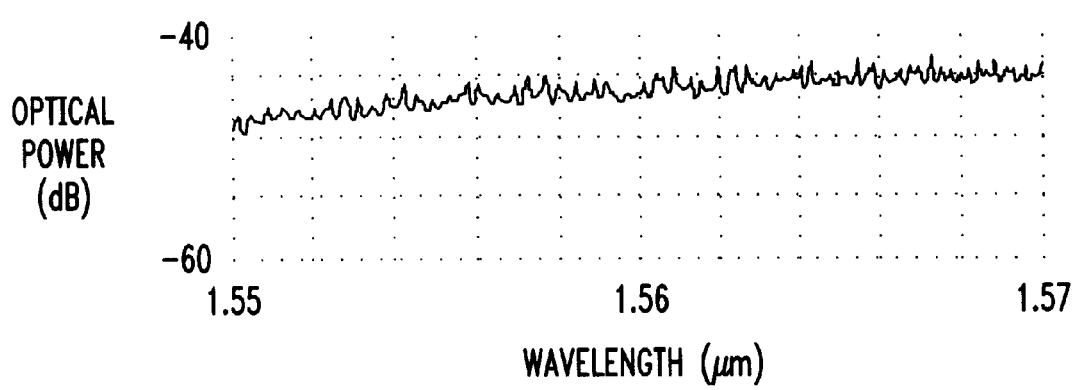
Figure 10A:
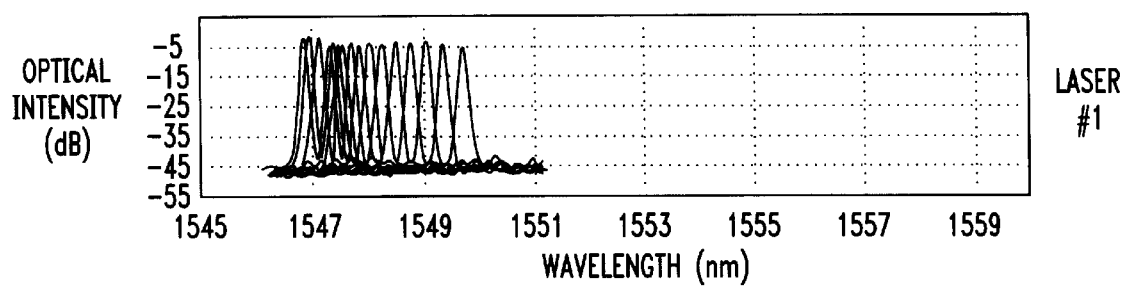
FIG. 10 depicts the wavelength tuning spectra of all six lasers for the hybrid integrated wavelength selectable optical transmitter of FIG. 1.
Figure 10B:
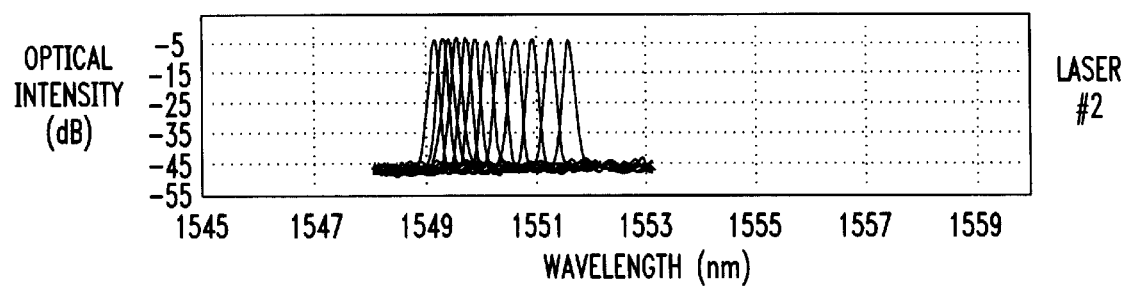
Figure 10C:
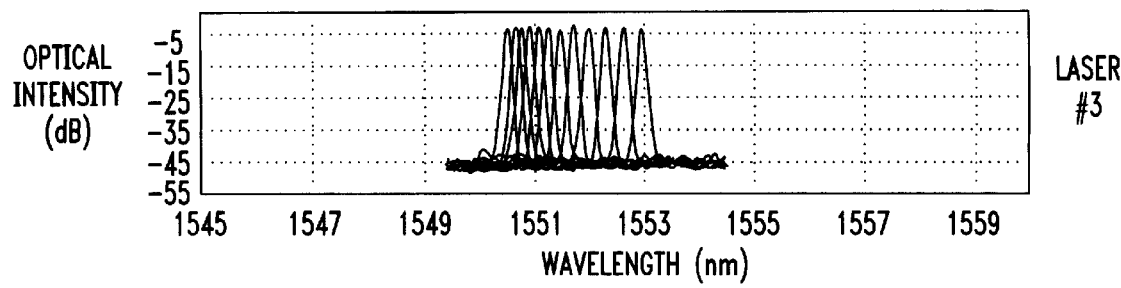
Figure 10D:
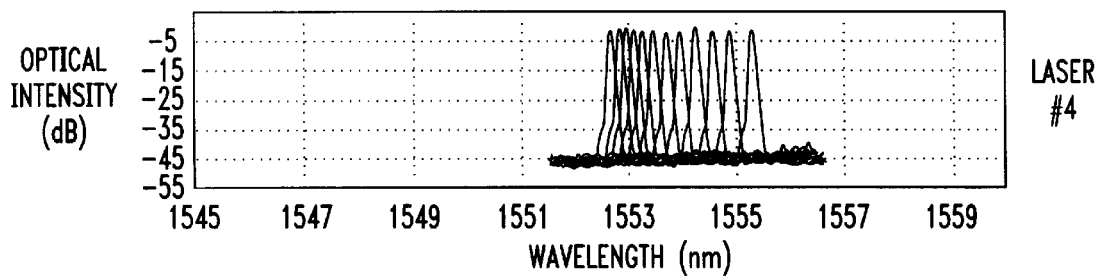
Figure 10E:
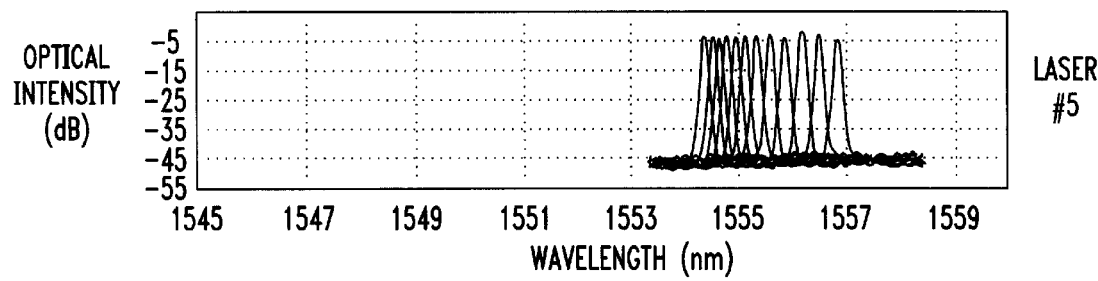
Figure 10F:
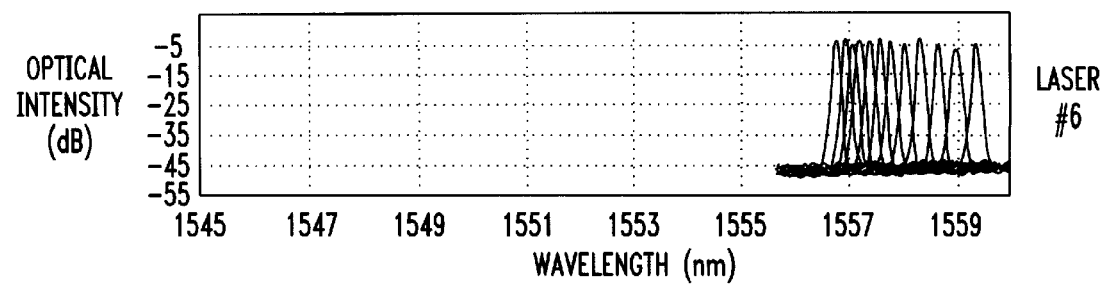

Shown in FIG. 7 is the light output versus amplifier bias current characteristics for five of the six lasers. Each laser is biased at 60 mA and held nominally at a temperature of 15° C. It is believed that the ripple in the so-called L-I curves is caused by ripple in the amplifier gain spectrum, and unrelated to any mode hopping or instability in the lasers. This latter amplifier ripple is about 2 dB and may be improved by better AR coatings as well as higher optical power injection into the amplifier. Photocurrent measurements indicate that the optical power coupled into the optical amplifier is about −12 to −8 dBm. The wavelength spectra, with and without the laser turned "on," are shown in FIGS. 8 and 9, respectively, indicating a better than 40 dB optical signal-to-noise ratio.

Figure 11:
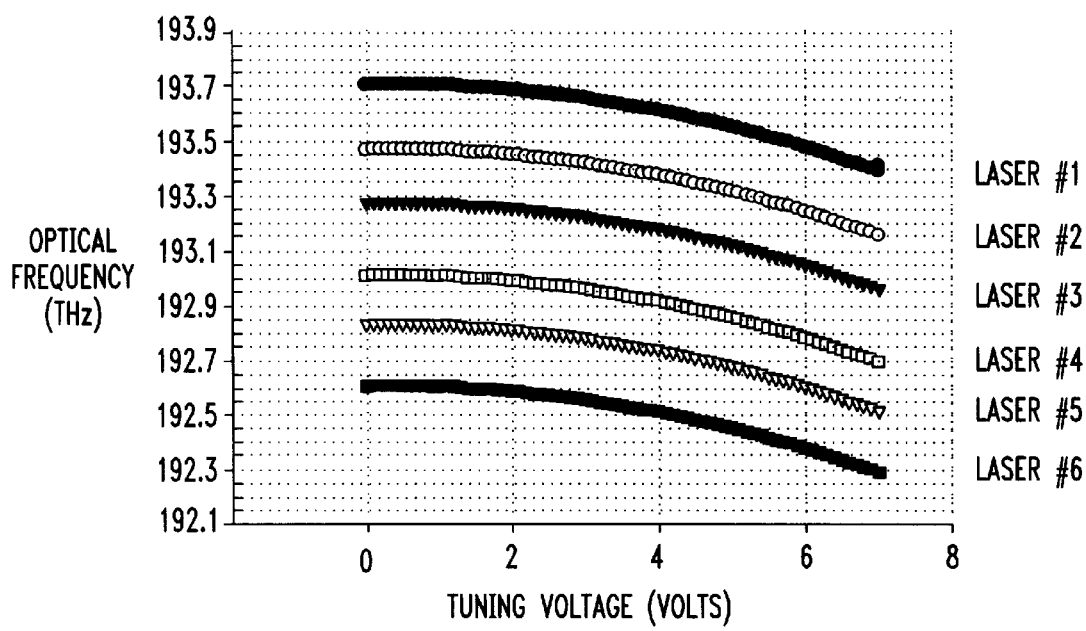
FIG. 11 depicts the optical frequency versus tuning voltage plot for the hybrid integrated wavelength selectable optical transmitter of FIG. 1.

Shown in FIG. 10 is the wavelength tuning characteristics of the above hybrid optical transmitter for each of the six lasers biased at 100 mA, and with the optical amplifier biased at 150 mA. Moreover, these measurements were taken with the temperature nominally set at 15° C. and then the tunning resistor biased with constant voltage steps of 0.2 volts. Shown in FIG. 11 is the associated plot of the optical frequency versus tuning resistor voltage for the six lasers. During these measurements, the compensating resistor is biased to provide a constant heat load of 1.15 W on the thermoelectric cooler. The first three wavelength spectra of laser number 1 and the last two spectra of laser number 6, however, were taken with the temperature nominally set 11° C. and 21.4° C., respectively, due to the inability of the present TEC to dissipate larger tuning powers. A total tuning range of 13.2 nm was achieved, sufficient for 32 WDM channels (50 GHz spacing). Decreasing the overlap between the wavelength tuning ranges would, of course, increase the number of available channels.

Figure 12:
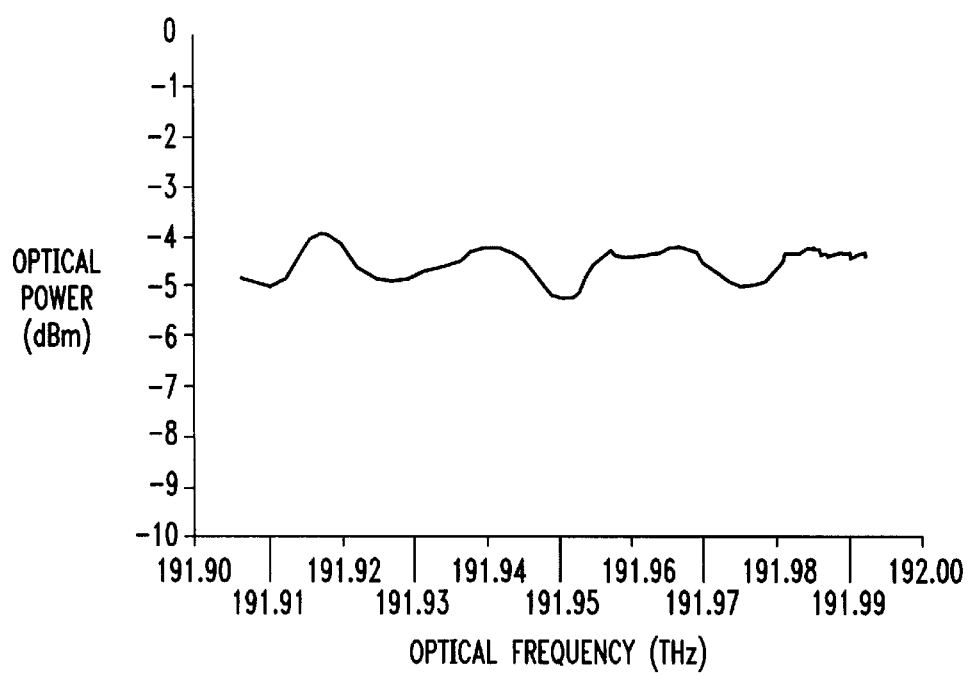
FIG. 12 depicts an optical power versus optical frequency plot for the hybrid integrated wavelength selectable optical transmitter of FIG. 1.

As seen in FIG. 10, there is some drop in the optical signal-to-noise ratio at elevated temperatures due to the decrease in the injected laser power. The signal-to-noise ratio, however, is still better than 38 dB over the entire tuning range. Inasmuch as the use of a localized tuning scheme does not substantially affect the temperature of the optical amplifier/modulator, there is minimal change in the laser output power, which is measured to be about 2 dB. This is better seen in FIG. 12, depicting the output power versus optical frequency for a single laser. The slight power variation is periodical and corresponds to the ripple observed in the optical amplifier spectrum.

Figure 13A:
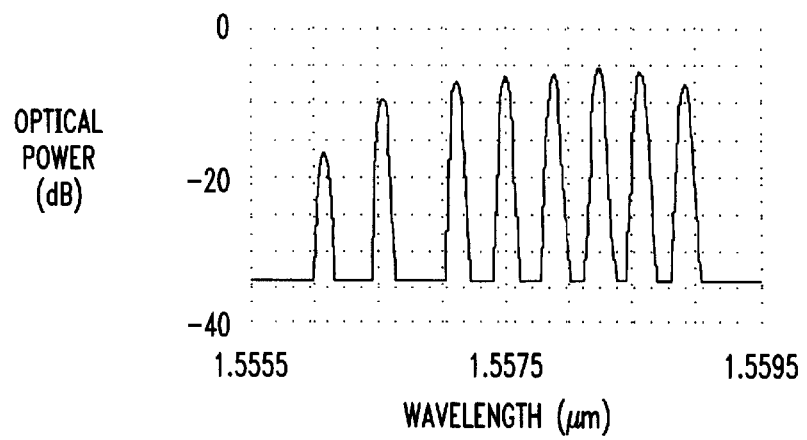
FIGS. 13(A)–(C) depict the spectral linewidth characteristics as a function of thermal tuning for the hybrid integrated wavelength selectable optical transmitter of FIG. 1, with and without the use of an input polarizer, and without the use of an optical isolator, respectively.
Figure 13B:
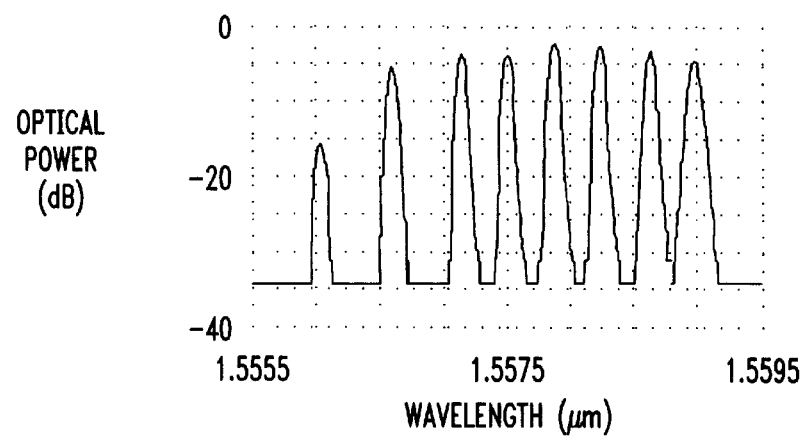
Figure 13C:
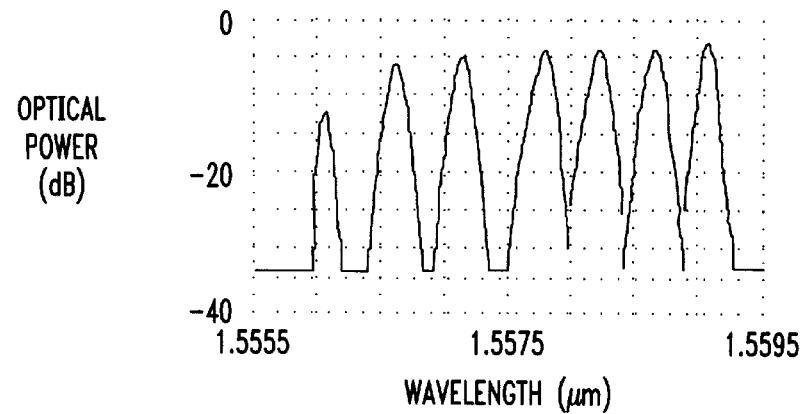

It should be clearly understood that any optical feedback from the front facet of the optical amplifier/modulator causes instability or self-pulsation readily observed as a broadening in the spectral linewidth. To examine this optical feedback, spectral linewidth measurements were made using different optical isolation configurations of the present invention, which measurements are illustrated in FIGS. 13(A)–(C). Specifically, FIG. 13A depicts the spectral linewidth for a single illustrative laser measured under thermal tuning and employing an optical isolator consisting of a Faraday rotator disposed between a polarizer and λ/2 waveplate, while in FIG. 13B the optical isolator consists of a Faraday rotator and λ/2 waveplate. With the former configuration, an optical isolation of about 19 dB is observed. Also, for comparison purposes, FIG. 13C depicts the tuning spectra obtained without the use of an optical isolator, showing large linewidth broadening for most of the tuned wavelengths.

Although some linewidth broadening is observed in FIG. 13B at the highest wavelength spectrum, none is observed in FIG. 13A. This may be due to some interaction of the back reflected TM radiations with the MQW laser array, or perhaps due to the somewhat better optical isolation that can be obtained with the use of an additional TE polarizer positioned in front of the Faraday rotator that compensates for misalignment between the optical components in the optical isolator.

Figure 14A:
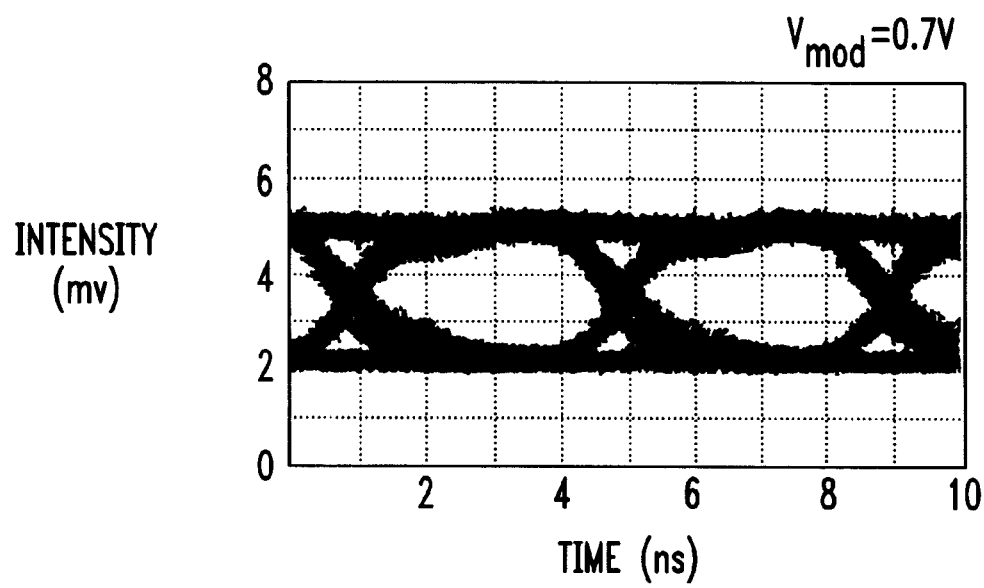
FIGS. 14(A)–(B) depict eye diagrams for the hybrid integrated wavelength selectable optical transmitter of FIG. 1 with a 2.5 Gb/sec modulation for modulator drive voltages of 0.7 and 0.8, respectively.
Figure 14B:
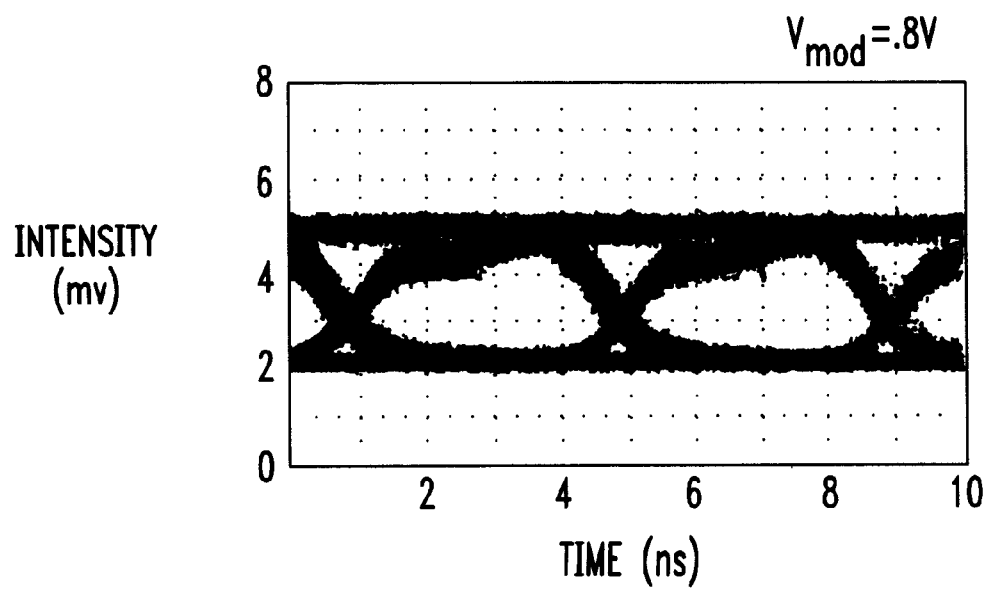

Due to the limited bandwidth of the optical amplifier/modulator, the constructed hybrid wavelength selectable optical transmitter is correspondingly so limited, and after packaging has a small bandwidth of about 2 GHz. Shown in FIGS. 14(A)–(B) are illustrative eye diagrams for a single channel operating at a 2.5 Gb/s modulation, with a modulator Rf drive voltage of 2 volts peak-to-peak; laser bias current of 100 mA; and amplifier bias current of 150 mA. Moreover, the modulator bias voltage is varied between 0.7 and 0.8 volts to show the trade off between "eye-opening" and "extinction ratio." As seen in FIGS. 14(A)–(B), although the former bias voltage provides a better "eye opening," the latter provides a better "extinction ratio."

Using an optical spectrum analyzer and a sampling oscilloscope, time-resolved wavelength measurements were made to investigate the chirp of the hybrid optical transmitter. Such measurements indicate the chirp to substantially less than about 0.09 Å.

Figure 15:
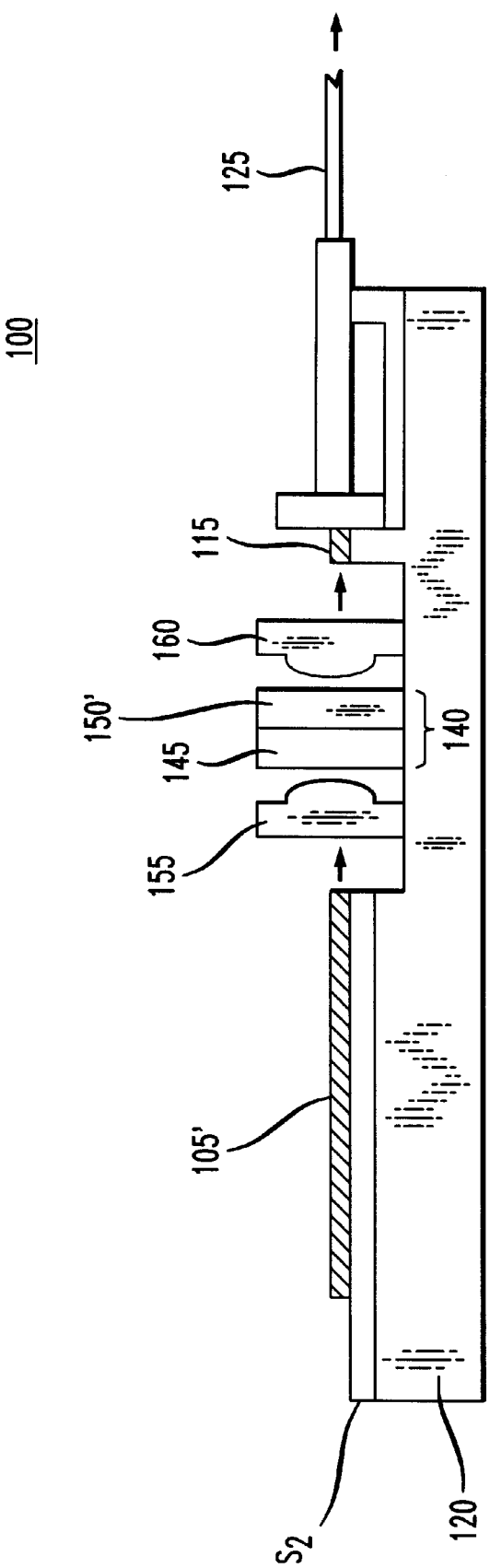
FIG. 15 depicts still another embodiment of the present invention similar to that of FIGS. 1–2, except employing a multiple frequency laser.

In accordance with the principles of the invention, shown in FIG. 15 is another embodiment of the present invention similar to that of FIGS. 1–2, except utilizing a waveguide grating router multiple frequency laser (MFL) 105' having a shared dispersive element disposed on a BeO ceramic platform 120. In comparison to typical distributed feedback lasers, such multiple frequency lasers have a relatively long cavity length. Because frequency wavelength shifts (chirp) induced by back reflected light is inversely proportional to the cavity length, multiple frequency lasers exhibit minimal chirp. Multiple frequency lasers are well known to those skilled the art and, hence, will not be discussed herein. A detailed discussion of multiple frequency lasers, however, can be found, for example, in the article by M. Zirngibl et al., entitled "Digitally Tunable Laser Based On The Integration Of A Waveguide Grating Multiplexer And An Optical Amplifier," *IEEE Photonics Technology Letters*, Vol. 6, No. 4, pp. 516–18 (April 1994); U.S. Pat. No. 5,444,725; and U.S. Pat. No. 5,576,881, which are incorporated herein by reference.

Two aspheric lenses 155, 160 couple the light from multiple frequency laser 105' into a monothically integrated chip containing optical amplifier/modulator 115. The optical amplifier/modulator design is polarization insensitive and is preferably oriented to couple light first into the optical amplifier which consists of alternating compressive and tensile strained quantum wells. Known fabrication techniques are used to form the monolithically integrated chip, such as the technique described in the aforementioned article by U. Koren et al., "Polarisation Insensitive Semiconductor Optical Amplifier With Integrated Electroabsorption Modulators," *Electron Lett.*, Vol. 32, No. 2, pp. 111–12 (January 1996).

Preferably, the monolithically integrated amplifier/modulator includes a beam expander at the end facet of the modulator. A 45° latching Faraday rotator 145 and polarizer 150' are positioned between the two lenses. Polarizer 150' is oriented at 45° such that transverse electrically (TE) polarized light exiting multiple frequency laser 105' propagates through optical isolator 140. Importantly, back reflected light from optical amplifier/modulator 115 propagates through the optical isolator, but is rotated to be transverse magnetically (TM) polarized. Multiple frequency laser 105' includes intracavity amplifiers that provide gain exclusively for TE polarized light. Advantageously, multiple frequency laser 105' is substantially insensitive to TM polarized light and thus to the unwanted back reflections. However, if desired, an additional TE polarizer may be positioned in front of the Faraday rotator to totally extinguish the TM polarized back reflections.

In this latter embodiment, one main performance issue is the effect of optical feedback from the optical modulator into the multiple frequency laser. Such shared dispersive element type lasers achieve single mode stability from gain nonlinearities. Multimoding, which is necessarily accompanied by intensity fluctuations, is suppressed by power saturation in the optical amplifier portion of the laser. That is, higher intensity light receives less gain, thereby flattening any changes in intensity. Back reflections, however, into the laser cavity with the appropriate phase can cause an effective negative gain wherein higher intensity light receives more effective gain, as discussed below herein.

Consider the field $U_c$ in the laser cavity passing through the intracavity amplifier with power gain G, and linewidth enhancement parameter α. A discussion of the linewidth enhancement parameter can be found in the book by I. P. Kaminow et al., entitled *Guided Wave Optoelectronics:* "Mode-Controlled Semiconductor Lasers," New York Springer-Verlag (1990). The intensity of the field reflecting off the output facet of reflectivity, $R_{int}$, added with a portion of the field that existed in the cavity a time, τ, ago and reflected back therein with a net reflectivity, $R_{ext}$, is given by:

$$|U_c(t)e^{G(t)(1+j\alpha)/2}\sqrt{R_{int}}+U_c(t-\tau)e^{G(t-\tau)(1+j\alpha)/2}\sqrt{R_{ext}}|^2 \qquad (3)$$

Now letting $$G(t)=G(t-\tau)+\Delta G(t) \qquad (4)$$

$$U_c(t)=U_c(t-\tau)e^{-j\Phi(t)} \qquad (5)$$

then if ΔG/G<<1, equation (3) may be approximated as $$|U_c|^2 e^G \Delta G[R_{int}+\sqrt{R_{int}R_{ext}}(\cos\Phi+\alpha\sin\Phi)] \qquad (6)$$

Those skilled in the art will recognize that the first term of equation (3) is the usual power saturation term responsible for suppressing intensity fluctuations that typically results from multimoding. As the intensity increases, the gain decreases. The second term is due, however, to the back reflection. Depending on its phase, the reflected light can act to reverse the gain such that the intensity increases as the gain decreases. When the phase of the reflected light is $-\Pi/2$, the magnitude of the negative gain is approximately a maximum since $\alpha$ is typically larger than unity. · This latter term becomes larger than the positive gain under the following condition:

$$\frac{R_{ext}}{R_{int}} > \frac{1}{\alpha^2} \quad (7)$$

When equation (7) is valid is, then depending on the relative phase of the reflected light, the lasing spectrum will become multimode. This is not unlike the phenomenon of additive pulse modelocking wherein short laser pulses are generated by appropriately biasing the external cavity. Additive pulse modelocking is reported in the article by E. P. Ippen et al., entitled "Additive Pulse Mode Locking," *J. Opt. Soc. Am. B*. Vol. 6, No. 9, pp. 1736–45 (September 1989).

Importantly, to ensure single mode operation, the normalized reflectivity $R_{ext}/R_{int}$ should be substantially less than $1/\alpha^2$. For example, for $\alpha=5$, the normalized reflectivity should be at least less than $-14$ dB.

Figure 16:
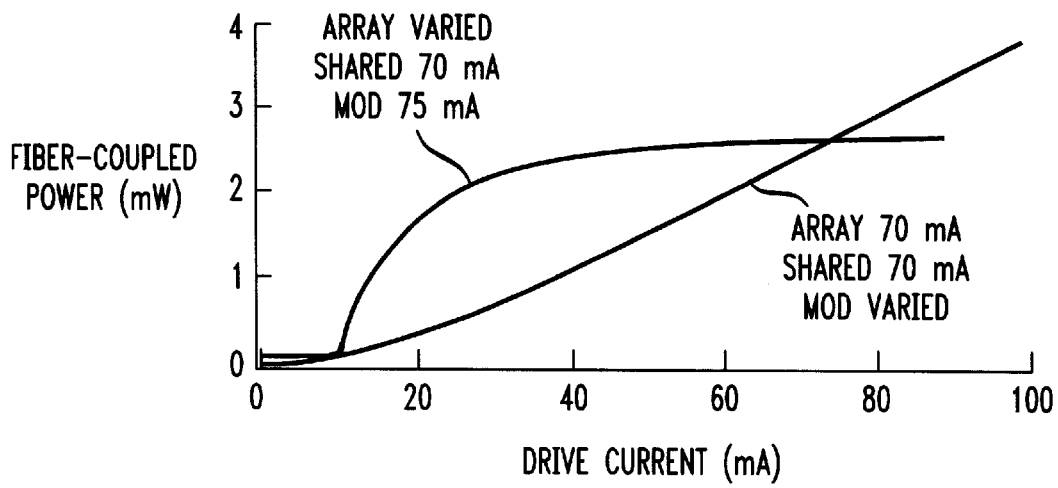
FIG. 16 depicts the light versus current curves for the hybrid integrated wavelength selectable optical transmitter of FIG. 15.

In an example from experimental practice, a 10 channel, 100 grating arm multiple frequency laser 105' was used, with each intracavity amplifier containing three InP quantum wells. FIG. 16 depicts the light versus current curves (unregulated temperature) for hybrid optical transmitter 100. Optical gain was provided exclusively for TE polarized light. The multiple frequency laser had a linewidth enhancement parameter, $\alpha$, of about 5.2, with a cavity mode spacing of about 3.0 GHz. A distance of about 12 mm separated the laser and optical amplifier/modulator. A latching Faraday rotator using a Bismuth doped rare earth iron garnet along with a 45° polarizer was positioned between the two aspheric lens (e.f.l.=1.45 mm; N.A.=0.55).

For this experimental arrangement, a lensed fiber was coupled to the optical amplifier/modulator designed to operate at 2.5 Gb/s. The following parameters were measured. Herein below, the laser drive current will be expressed as "array drive current, shared amplifier drive current," whereas the drive to the optical amplifier/modulator will be expressed as "amplifier current, modulator bias voltage."

| Parameters | Value |
|---|---|
| Laser Power (@ 50 mA, 50 mA) | +3 dBm |
| Coupling Loss (w/ isolation) Laser to Amplifier/Modulator | −3.6 dB |
| Coupling Loss (w/o isolation) Laser to Amplifier/Modulator | −3.1 dB |
| Power Coupled into Fiber Laser (@ 50 mA, 50 mA) Amplifier/Modulator (@ 75 mA, 0 V) | +3.5 dBm |
| Modulator/Amplifier Compressed Gain | 8.1 dB |
| Modulator/Amplifier Uncompressed Gain | 11.1 dB |

With the laser off, the optical amplifier/modulator at a bias current of 75 mA exhibits a ripple, K, in its spontaneous emission spectrum of about 1 dB peak-to-peak. The average reflectivity of each end facet of the optical amplifier/modulator may be determined from the following equation:

$$R=\gamma+L_{mod}-G \quad (8)$$

$$\text{where} \quad \gamma = \frac{\sqrt{K}-1}{\sqrt{K}+1} \quad (10)$$

and, where R, $\gamma$, $L_{mod}$ and G are expressed in db. See, H. Takeuchi et al., "Low Loss Single-Mode GaAs/AlGaAs Miniature Optical Waveguides With Straight And Bending Structures," *J. Lightwave Technol.*, Vol. 7, No. 7, pp. 1044–54 (July 1989).

In accordance with equations (8) and (9), the reflectivity of each end facet, $R_{mod}$ is calculated to be about −21.5 dB. Furthermore, the net reflectivity from the modulator facet back into the laser divided by the laser facet reflectivity is given by:

$$R_{ext}-R_{int}=2(1-R_{int})+R_{mod}-2L_{mod}+2G-2L_{coup}-R_{int}=-13.8 \text{ dB} \quad (11)$$

As such, the normalized reflectivity ratio $R_{ext}/R_{int}$ is about −13.8 dB and hence much greater than $1/\alpha^2=-14.3$ dB. Without optical isolation, multilongitudinal mode lasing is expected when the phase of the reflected light from the front end facet of the optical modulator is of the appropriate value.

Without the use of optical isolator 140, the relative intensity noise (RIN) and laser linewidth are −141.0 dB/Hz and 910 kHz, respectively, for a positive gain phase. For a negative gain phase, the RIN and laser linewdith are −140.5 dB/Hz and 1.2 MHZ, respectively. These measurements were made at a laser drive of 70 mA, 70 mA, and an amplifier/modulator drive of 75 mA, 0 V. With optical isolation, the RIN and linewidth are 142 dB/Hz and 1.2 MHZ, respectively.

Figure 17:
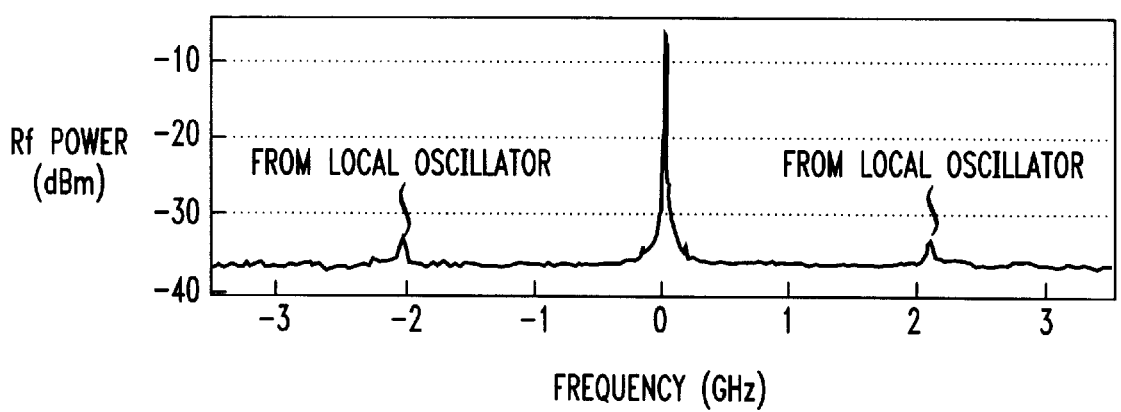
FIGS. 17 and 18 depict the wavelength spectra for the hybrid integrated wavelength selectable optical transmitter of FIG. 15, without the optical isolator in position, for amplifier/modulator bias currents of 79 and 51 mA, respectively.
Figure 18:
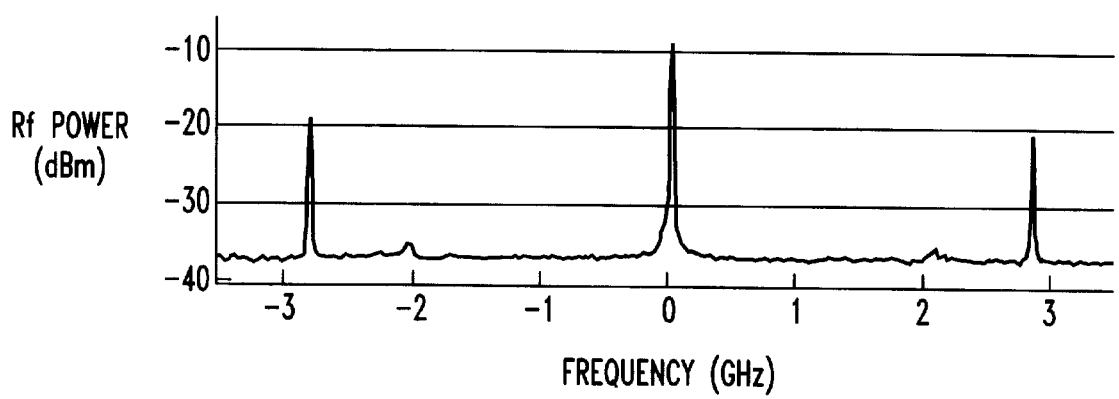

Shown in FIGS. 17–18 are exemplary wavelength spectra of the above hybrid wavelength selectable transmitter obtained through heterodyne detection. These spectra were obtained without optical isolator 140. More specifically, radiation from the transmitter and an external cavity tunable laser tuned to a frequency 10 GHz therefrom were optically summed and displayed on a Rf spectrum analyzer. FIGS. 17 and 18 illustrate the optical power spectra for the optical amplifier/modulator at bias currents of 79 and 51 mA, respectively. As evident from FIG. 17 (negative gain phase) and FIG. 18 (positive gain phase), the adjacent cavity modes are either enhanced or suppressed, depending on the phase of the reflected light. As expected for a phase dependent phenomenon, the side modes vary sinusoidally with the amplifier/modulator bias current, as expected in the absence of optical isolation.

Figure 19:
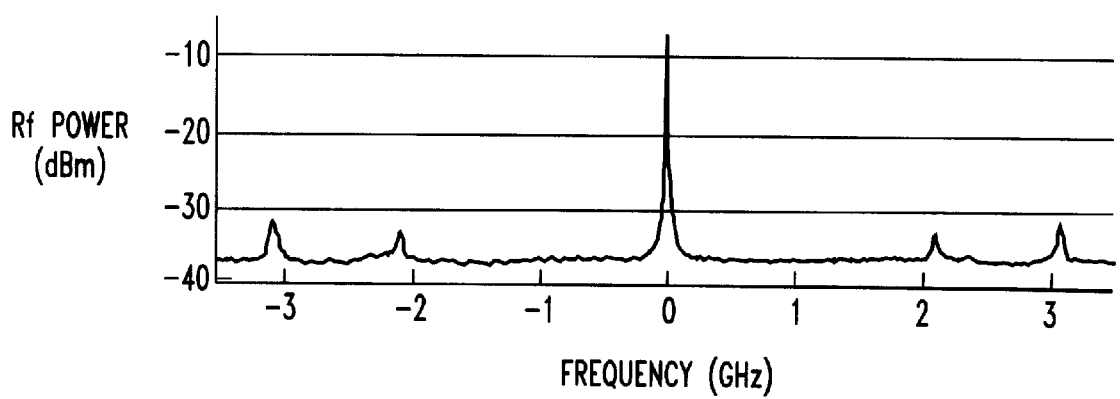
FIG. 19 depicts the wavelength spectrum for the hybrid integrated wavelength selectable optical transmitter of FIG. 15, with the optical isolator in position.

Experimental measurements furthermore indicate that the Faraday rotator and polarizer provide optical isolation of about 14 dB, which is sufficient to prevent multimode lasing. Shown in FIG. 19 is the optical power spectrum with the use of an optical Faraday rotator and polarizer, which clearly confirms the suppression of side modes by at least 49 dB (optical power).

Figure 20:
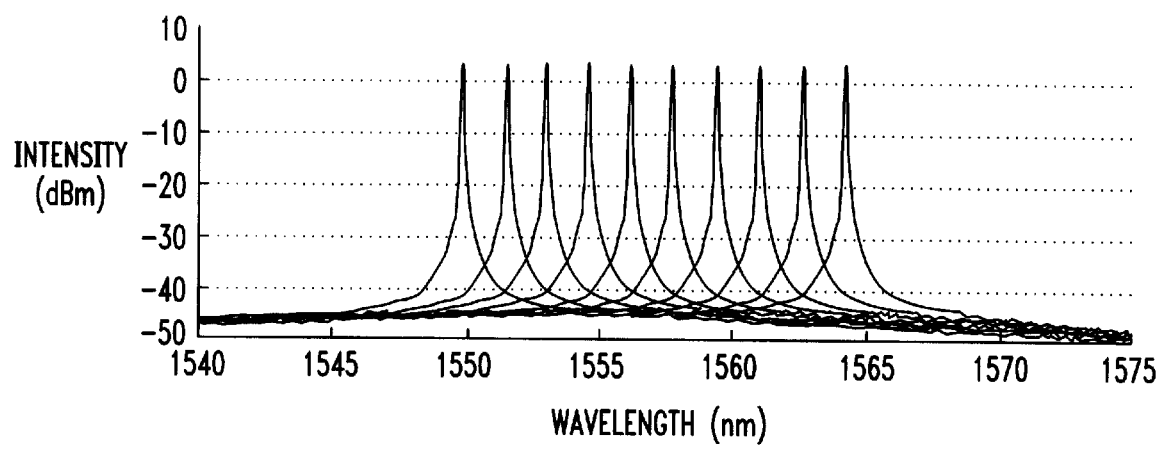
FIG. 20 depicts the optical spectra of all 10 channels of the hybrid integrated wavelength selectable optical transmitter of FIG. 15.

Shown in FIG. 20 is the optical spectra of all ten (10) channels of the transmitter obtained from experimental measurements. Importantly, the background optical power is nearly 50 dB below that of the lasing modes, despite the unwanted spontaneous emission added by the optical amplifier/modulator. Using a wavemeter, the average channel spacing is 199.8 GHz±1.5 GHz.

FIGS. 21–26 depict design considerations for the above embodiment of the hybrid transmitter utilizing a multiple frequency laser. Unless otherwise indicated, the measurements were obtained using the following parameters: laser drive @ 70 mA, 70 mA; amplifier/modulator drive @ 75 mA, −2.1 V; and modulator drive voltage @ 5 V peak-to-peak.

Figure 21:
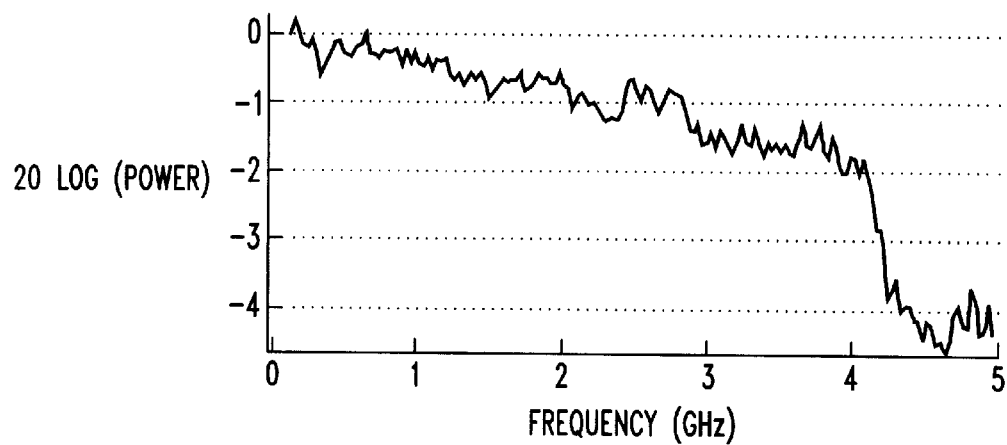
FIG. 21 depicts the small-signal frequency response of the optical modulator, with the optical isolator in position.
Figure 22A:
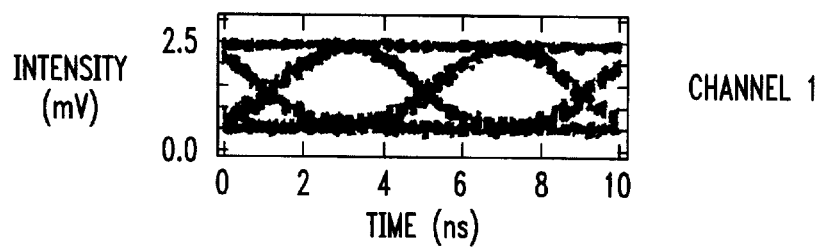
FIG. 22 depicts the eye diagrams for all 10 channels of the hybrid integrated wavelength selectable optical transmitter of FIG. 15 with a $2^{23}$-1 pseudo-random pattern at 2.5 Gb/s.
Figure 22B:
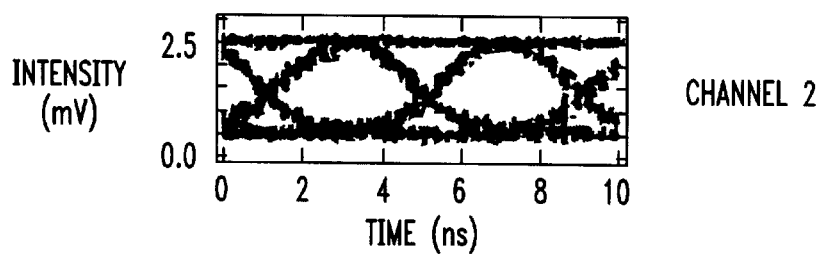
Figure 22C:
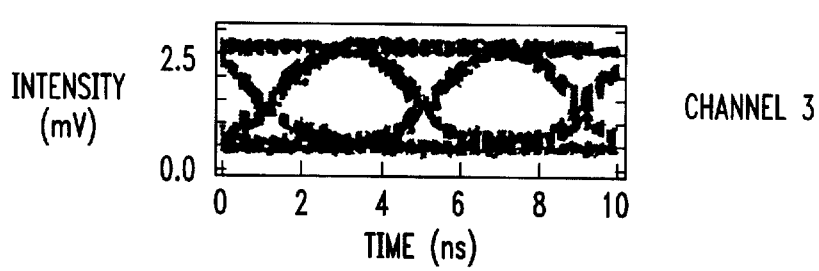
Figure 22D:
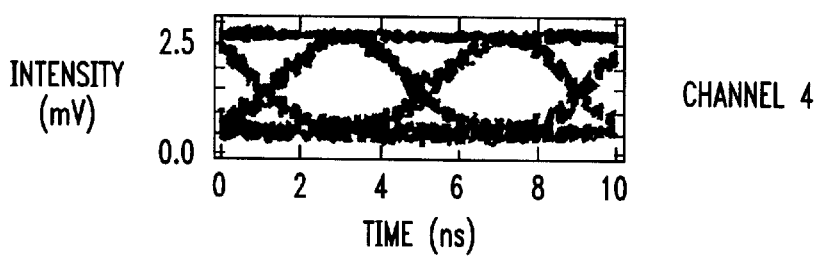
Figure 22E:
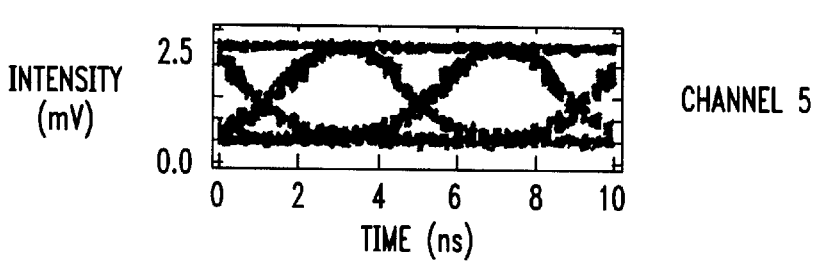
Figure 22F:
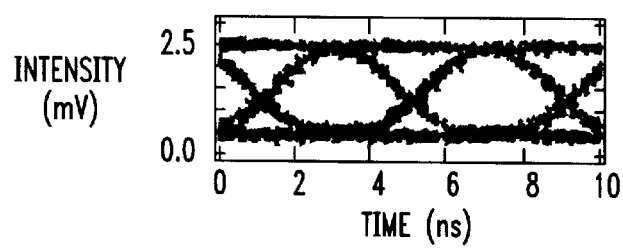
Figure 22G:
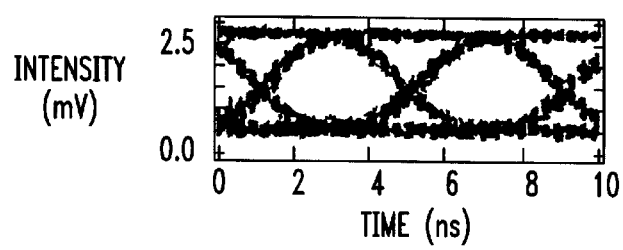
Figure 22H:
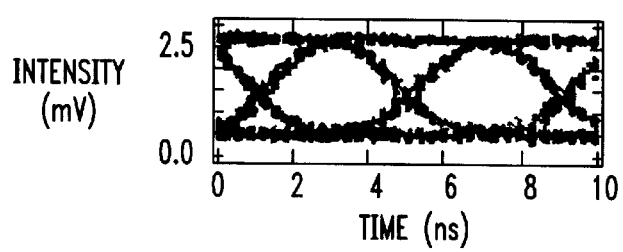
Figure 22I:
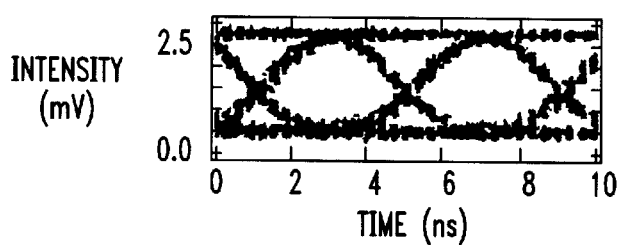
Figure 22J:
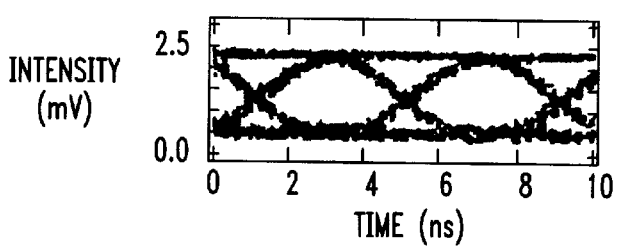
Figure 23:
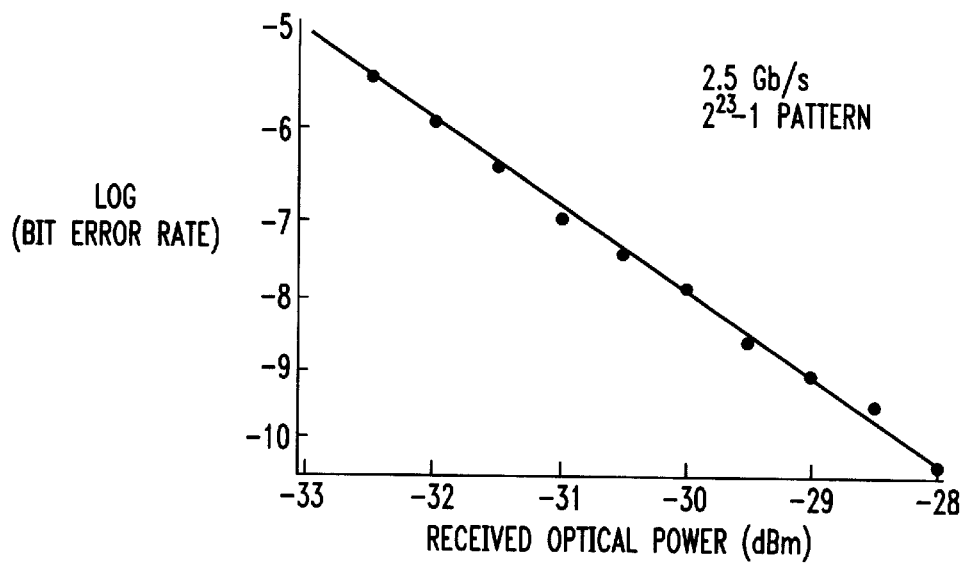
FIG. 23 depicts the bit-error curve of channel five (5) of the hybrid integrated wavelength selectable optical transmitter of FIG. 15.

Shown in FIG. 21 is the small-signal frequency characteristics of the optical modulator, indicating an electrical 3 dB bandwidth of about 4.2 GHz. Eye diagrams for all 10 channels are shown in FIG. 22 for a 2.5 Gb/s, $2^{23}-1$ pseudo random pattern (using a 1.87 GHz bandwidth electronic filter). Because the optical modulator is made of bulk material, the optical bandwidth is broad. The extinction ratio, however is only about 7.5 dB. Specifically shown in FIG. 23 is an exemplary bit-error curve for channel 5.

Figure 24A:
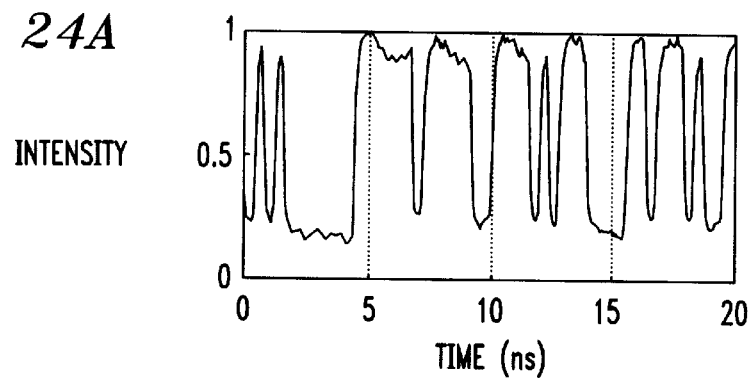
FIGS. 24(A)–(B) depict the laser intensity and wavelength versus time profiles, respectively, for the hybrid integrated wavelength selectable optical transmitter of FIG. 15, without the optical isolator in position.
Figure 24B:
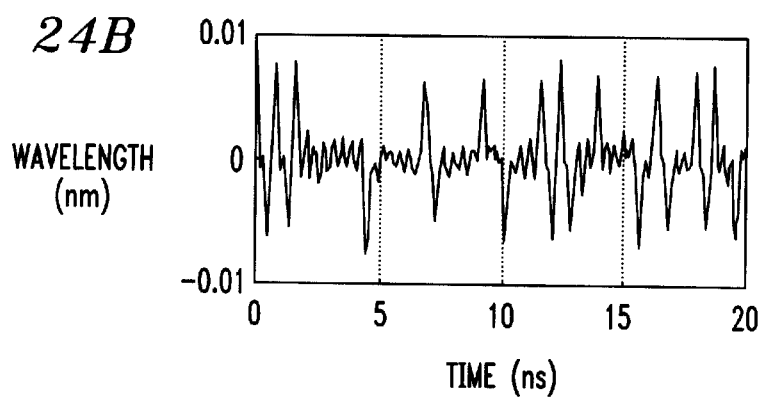
Figure 25A:
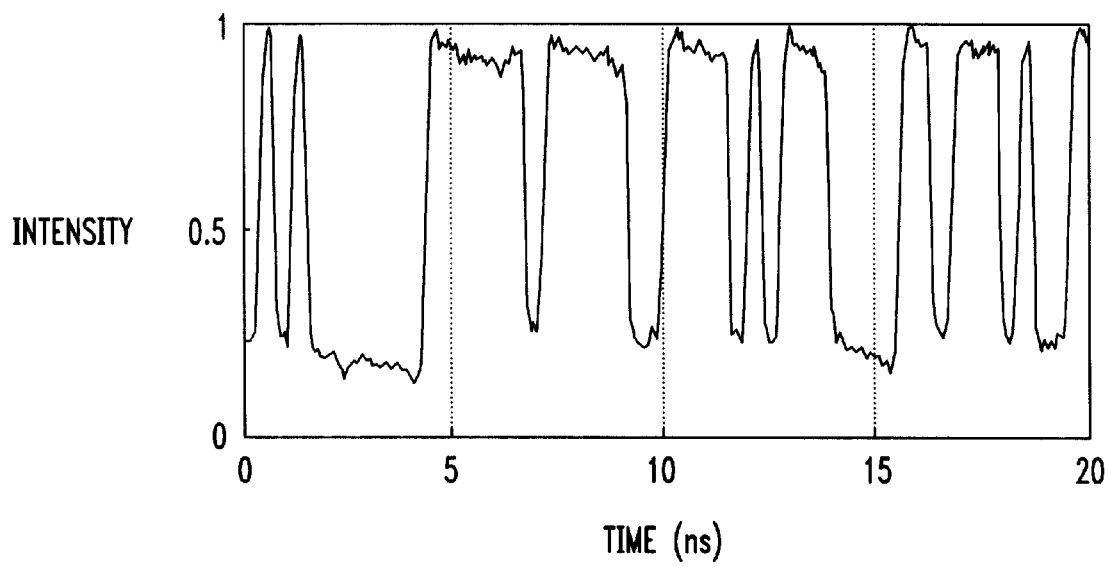
FIGS. 25(A)–(B) depict the laser intensity and wavelength versus time profiles, respectively, for the hybrid integrated wavelength selectable optical transmitter of FIG. 15, with the optical isolator in position.
Figure 25B:
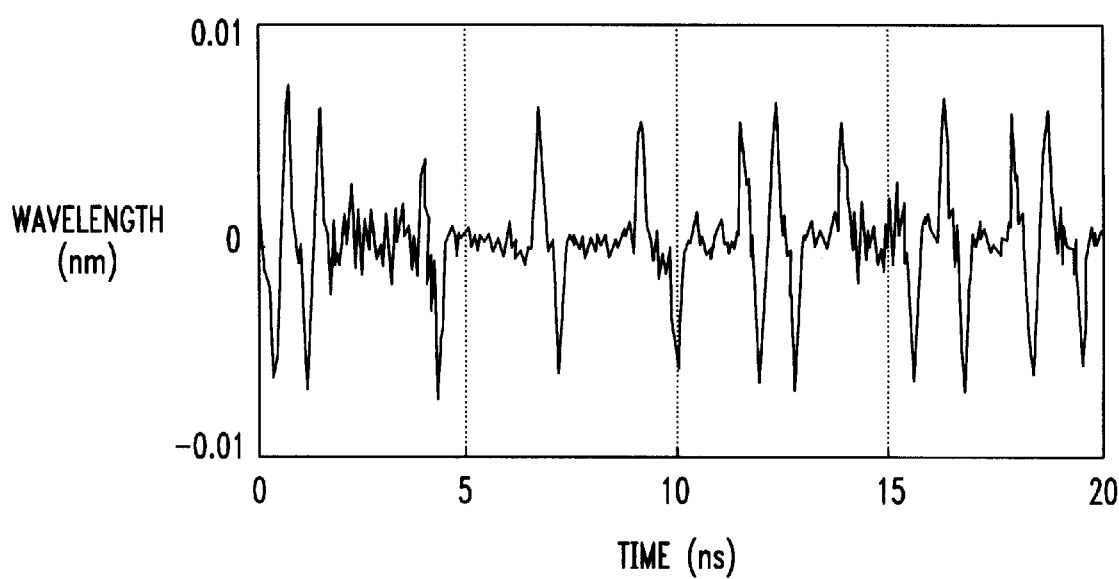
Figure 26F:
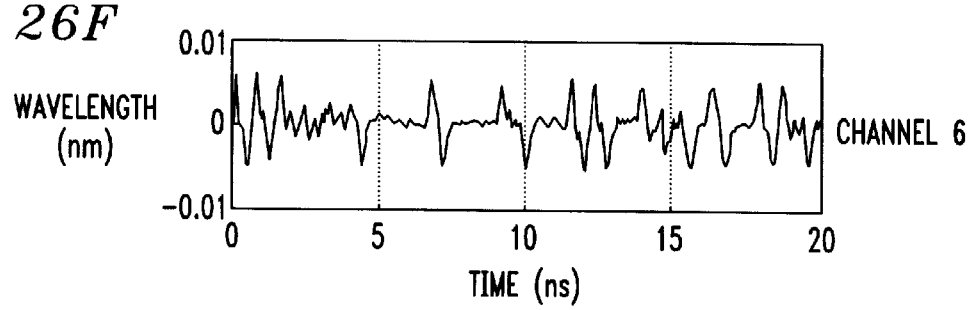
FIG. 26 depicts the wavelength versus time profiles for all ten (10) channels of the hybrid integrated wavelength selectable optical transmitter of FIG. 15, with the optical isolator in position.
Figure 26G:
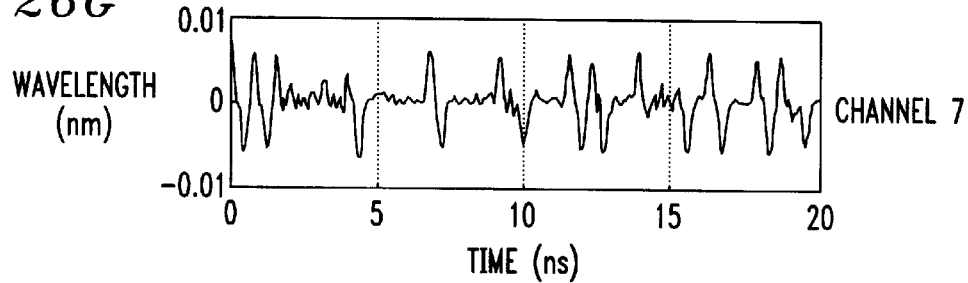
Figure 26H:
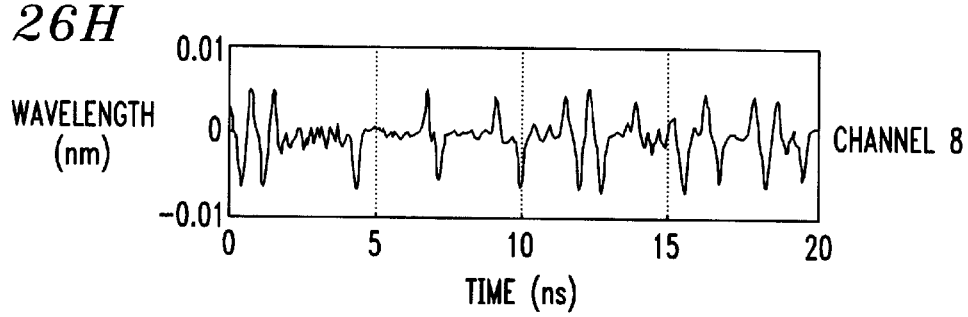
Figure 26I:
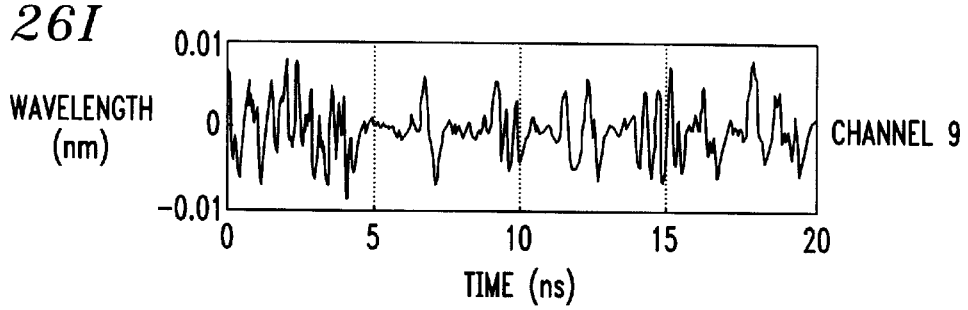
Figure 26J:
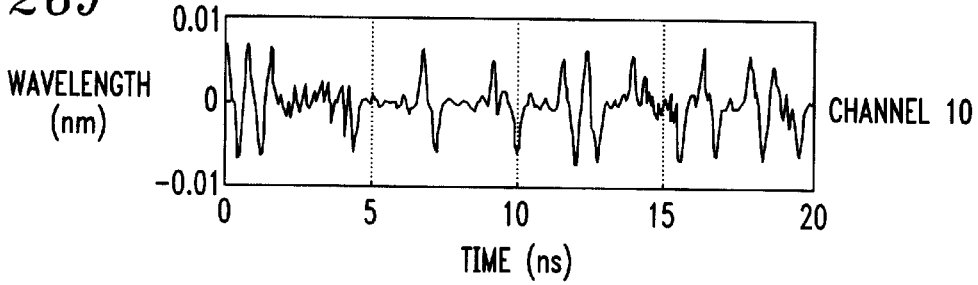

Using an optical spectrum analyzer and a sampling oscilloscope, time-resolved wavelength measurements were made to investigate the chirp of hybrid transmitter 100. Shown in FIGS. 24(A)–(B) are the laser intensity and wavelength versus time plots, respectively, for the present hybrid optical transmitter without the use of the optical isolator. FIGS. 25(A)–(B), however, depict the laser intensity and wavelength versus time plots, respectively, with the use of the optical isolator. As one can see, without optical isolation, back reflections from the optical modulator cause small distortions in the intensity waveform as well as small wavelength perturbations. Indeed, when the lasing is multimode due to some back reflections, the intensity bit pattern becomes noisy.

With the use of the optical isolator, the chirp is substantially minimized and nearly identical for all ten channels, as further depicted in FIG. 26.

It should be understood that the embodiments herein are merely illustrative of the principles of the invention. Various modifications may be made by those skilled in the art which will embody the principles of the invention and fall within the spirit and the scope thereof.

What is claimed is:

1. An optical transmitter comprising:
    an optical platform;
    a wavelength selectable laser source generating radiation polarized substantially along a first direction;
    an optical modulator;
    optical isolation means for rotating the polarization of said radiation such that radiation reflected back through said optical isolation means from said optical modulator is polarized orthogonal to said first direction; and
    means for optically coupling radiation from said wavelength selectable laser source through said optical isolation means to said optical modulator, and said wavelength selectable laser source, optical isolation means and optical modulator disposed on said optical platform.

2. The optical transmitter of claim 1 wherein said optical modulator is polarization insensitive.

3. The optical transmitter of claim 1 further comprising first and second photonic integrated chips, said wavelength selectable laser source being integrated on said first photonic integrated chip and said optical modulator being integrated on said second photonic integrated chip.

4. The optical transmitter of claim 1 wherein said means for optically coupling includes means for collimating the radiation from said wavelength selectable laser source.

5. The optical transmitter of claim 1 wherein said wavelength selectable laser is polarization sensitive to radiation substantially along only said first direction.

6. The optical transmitter of claim 1 wherein said means for optically coupling includes an optical combiner.

7. The optical transmitter of claim 1 further comprising an optical amplifier optically coupled to said optical modulator.

8. The optical transmitter of claim 1 further comprising first, second and third substrates, said wavelength selectable laser source integrated on said first substrate, said means for optically coupling integrated on said second substrate, and said optical modulator integrated on said third substrate.

9. The optical transmitter of claim 1 further comprising first and second substrates, said wavelength selectable laser source integrated on said first substrate, and said optical modulator integrated on said second substrate.

10. The optical transmitter of claim 1 wherein said optical isolation means includes a 45° Faraday rotator.

11. The optical transmitter of claim 10 wherein said Faraday rotator is a latching Faraday rotator.

12. The optical transmitter of claim 10 wherein said optical isolation means further includes a half-wave plate, disposed between said Faraday rotator and said optical modulator.

13. The optical transmitter of claim 10 wherein said optical isolation mean further includes a polarizer having a transmission axis rotated 45° from said first direction, and said polarizer disposed between said Faraday rotator and said optical modulator.

14. The optical transmitter of claim 1 wherein said wavelength selectable laser source includes a tunable laser.

15. The optical transmitter of claim 1 wherein said wavelength selectable laser source includes a laser array.

16. The optical transmitter of claim 15 wherein said laser array is a tunable DFB laser array.

17. The optical transmitter of claim 1 wherein said wavelength selectable laser source includes a multiple frequency laser.

18. The optical transmitter of claim 1 wherein the normalized reflectivity, $R_{ext}/R_{int}$ is less than $1/\alpha^2$, where $\alpha$ is the linewidth enhancement parameter of said wavelength selectable laser source, $R_{int}$ is the reflectivity of an end facet of said wavelength selectable laser and $R_{ext}$ is the reflectivity of an end facet of said optical modulator.

19. The optical transmitter of claim 1 further comprising an optical waveguide coupled to the output of said optical modulator.

20. The optical transmitter of claim 1 further comprising first and second lenses, said first lens disposed between said wavelength selectable laser source and said optical isolation means, and said second lens disposed between said optical isolation means and said optical modulator.

21. The optical transmitter of claim 1 further including means for regulating the temperature of said wavelength selectable laser source.

22. The optical transmitter of claim 21 wherein said means for regulating includes a thermoelectric cooler.

23. The optical transmitter of claim 21 wherein said means for regulating includes a localized heater disposed on said wavelength selectable laser source.

24. The optical transmitter of claim 21 further including a compensating heater.

25. A hybrid optical transmitter comprising:
    an optical platform;
    first and second substrates disposed on said optical platform;
    a wavelength selectable laser source;
    an optical modulator;
    means for coupling radiation egressing from said wavelength selectable laser source to said optical modulator; and
    means for isolating said wavelength selectable laser source from radiation reflected from said optical modulator, said wavelength selectable laser source integrated on said first substrate, and said optical modulator integrated on said second substrate.

26. The hybrid optical transmitter of claim 25 wherein said means for isolating is characterized by the radiation egressing from said wavelength selectable laser source and reflections from said optical modulator traversing back through said means for isolating being orthogonally polarized.

27. The hybrid optical transmitter of claim 25 wherein said means for isolating includes a polarizer having a transmission axis along a first direction, a 45° Faraday rotator and a half-wave plate, said Faraday rotator being disposed between said polarizer and said half-wave plate such that reflections from said optical modulator are first polarized orthogonal to said first direction and then extinguished by said polarizer.

28. The hybrid optical transmitter of claim 25 wherein said means for coupling includes an optical combiner.

29. The hybrid optical transmitter of claim 25 further including an optical amplifier optically coupled to said optical modulator.

30. The hybrid optical transmitter of claim 25 further including a third substrate, said means for coupling integrated on said third substrate.

31. The hybrid optical transmitter of claim 25 wherein said means for coupling is integrated on said first substrate.

32. The hybrid optical transmitter of claim 25 wherein said means for isolating includes a 45° Faraday rotator.

33. The hybrid optical transmitter of claim 32 wherein said Faraday rotator is a latching Faraday rotator.

34. The hybrid optical transmitter of claim 32 wherein said means for isolating further includes a polarizer having a transmission axis rotated 45° to said first direction, and said polarizer being disposed between said Faraday rotator and said optical modulator.

35. The hybrid optical transmitter of claim 32 wherein said means for isolating further includes a half-wave plate, and said half-wave plate being disposed between said Faraday rotator and said optical modulator.

36. The hybrid optical transmitter of claim 25 wherein said wavelength selectable laser source includes a tunable laser.

37. The hybrid optical transmitter of claim 25 wherein said wavelength selectable laser source includes a tunable DFB laser array.

38. The hybrid optical transmitter of claim 25 wherein said wavelength selectable laser source includes a multiple frequency laser.

39. The hybrid optical transmitter of claim 25 further including means for regulating the temperature of said wavelength selectable laser source.

40. A hybrid optical transmitter comprising:
   an optical platform;
   first and second photonic integrated chips disposed on said optical platform;
   a wavelength selectable laser source integrated on said first photonic integrated chip, said laser source emitting radiation substantially polarized along a first direction;
   an optical amplifier/modulator integrated on said second photonic integrated chip; and
   an optical isolator, including at least a latching Faraday rotator, disposed between said wavelength selectable laser source and said optical amplifier/modulator for isolating said wavelength selectable laser source from radiation reflected from said optical amplifier/modulator.

41. The hybrid optical transmitter of claim 40 wherein said Faraday rotator is a 45° Faraday rotator such that radiation egressing from said wavelength selectable laser source and reflections from said optical amplifier/modulator traversing back through said optical isolator are orthogonally polarized.

42. The hybrid optical transmitter of claim 40 wherein said optical isolator further includes a half-wave-plate disposed between said Faraday rotator and said optical amplifier/modulator.

43. The hybrid optical transmitter of claim 40 wherein said optical isolator further includes a polarizer having a transmission axis rotated 45° with respect to said first direction such that radiation egressing from said wavelength selectable laser source and reflections from said optical amplifier/modulator traversing back through said optical isolator are orthogonally polarized.

44. The hybrid optical transmitter of claim 40 wherein said optical isolator further includes a half-wave plate and a polarizer having a transmission axis along said first direction, said Faraday rotator disposed between said polarizer and said half-wave plate such that reflections from said optical amplifier/modulator are first polarized orthogonal to said first direction and then extinguished.

45. The hybrid optical transmitter of claim 40 wherein said optical isolator further includes a polarizer disposed between said wavelength selectable laser source and said Faraday rotator, said polarizer having a transmission axis along said first direction.

46. The hybrid optical transmitter of claim 40 wherein said wavelength selectable laser source includes a tunable laser.

47. The hybrid optical transmitter of claim 40 wherein said wavelength selectable laser source includes a multiple frequency laser.

48. The hybrid optical transmitter of claim 40 further including means for regulating the temperature of said wavelength selectable laser source.

* * * * *